US011861941B1

(12) United States Patent
Molner et al.

(10) Patent No.: US 11,861,941 B1
(45) Date of Patent: Jan. 2, 2024

(54) EYE CAMERA SYSTEMS WITH POLARIZED LIGHT

(71) Applicant: Apple Inc., Cupertino, CA (US)

(72) Inventors: Keenan Molner, Palo Alto, CA (US); Qiong Huang, Cupterino, CA (US); Branko Petljanski, San Jose, CA (US); Edward A. Valko, San Jose, CA (US); Tom Sengelaub, San Francisco, CA (US); Martin Haller, Mountain View, CA (US); Andrei Nikiforov, Berlin (DE); Hua Gao, Cupertino, CA (US); Emanuele Mandelli, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 165 days.

(21) Appl. No.: 16/779,297

(22) Filed: Jan. 31, 2020

Related U.S. Application Data

(60) Provisional application No. 62/802,138, filed on Feb. 6, 2019.

(51) Int. Cl.
*G06V 40/19* (2022.01)
*G02B 27/01* (2006.01)
(Continued)

(52) U.S. Cl.
CPC ........... *G06V 40/19* (2022.01); *G02B 5/3025* (2013.01); *G02B 27/0172* (2013.01);
(Continued)

(58) Field of Classification Search
CPC .... G06K 9/00604; G06V 40/18; G06V 40/19; G02B 2027/0161
See application file for complete search history.

(56) References Cited

U.S. PATENT DOCUMENTS

| 7,091,661 B2 * | 8/2006 | Ouderkirk | ............. H01L 33/505 313/112 |
| 7,401,920 B1 * | 7/2008 | Kranz | .................... A61B 3/113 351/209 |

(Continued)

FOREIGN PATENT DOCUMENTS

JP 2014183192 9/2014

OTHER PUBLICATIONS

MacRumors, "Apple Glasses", online (Nov. 20, 2020), https://www.macrumors.com/roundup/apple-glasses/ (Year: 2020).*

(Continued)

*Primary Examiner* — David N Werner
(74) *Attorney, Agent, or Firm* — Robert C. Kowert; Kowert, Hood, Munyon, Rankin & Goetzel, P.C.

(57) ABSTRACT

Methods and apparatus for using polarized light (e.g., infrared (IR) light) to improve eye-related functions such as iris recognition. An eye camera system includes one or more IR cameras that capture images of the user's eyes that are processed to perform iris recognition, gaze tracking, or other functions. At least one polarizing element may be located in the path of the light which is used to capture images of the user's eye. The user's eye may be illuminated by IR light emitted by one or more LEDs. At least one of the LEDs may be an LED with a polarizing filter. Instead or in addition, at least one polarizer may be located at the eye camera sensor, in the eye camera optics, or as or in an additional optical element located on the light path between the eye camera and the user's eye.

22 Claims, 20 Drawing Sheets

(51) Int. Cl.
  *G02B 5/30* (2006.01)
  *G06V 40/18* (2022.01)
  *H01L 31/0203* (2014.01)
  *H01L 31/0216* (2014.01)

(52) U.S. Cl.
  CPC ...... *G06V 40/18* (2022.01); *G02B 2027/0161* (2013.01); *G02B 2027/0178* (2013.01); *H01L 31/0203* (2013.01); *H01L 31/0216* (2013.01)

(56) References Cited

U.S. PATENT DOCUMENTS

| | | | |
|---|---|---|---|
| 7,740,375 B2 | 6/2010 | Zou et al. | |
| 8,637,883 B2 | 1/2014 | Chakraborty | |
| 9,330,302 B2 | 5/2016 | Thukral et al. | |
| 9,606,354 B2 | 3/2017 | Spitzer et al. | |
| 9,737,209 B2 | 8/2017 | Gramatikov et al. | |
| 9,954,145 B2 | 4/2018 | Radkov et al. | |
| 9,960,322 B2 | 5/2018 | van de Ven | |
| 10,311,584 B1* | 6/2019 | Hall | G06T 7/251 |
| 10,413,177 B2 | 9/2019 | Watanabe et al. | |
| 10,417,784 B1* | 9/2019 | Cavin | G02B 27/0093 |
| 10,509,466 B1* | 12/2019 | Miller | G06K 9/52 |
| 10,733,439 B1* | 8/2020 | Geng | G06K 9/2036 |
| 11,138,301 B1* | 10/2021 | Castañeda | H04W 4/80 |
| 2005/0190445 A1 | 9/2005 | Fukuzaki | |
| 2006/0140454 A1* | 6/2006 | Northcott | A61B 3/1216 382/117 |
| 2010/0245093 A1* | 9/2010 | Kobetski | G06K 9/00597 340/576 |
| 2010/0278394 A1* | 11/2010 | Raguin | G06K 9/00604 382/117 |
| 2011/0069277 A1* | 3/2011 | Blixt | G06K 9/00604 351/210 |
| 2011/0170061 A1* | 7/2011 | Gordon | G06K 9/00604 351/206 |
| 2013/0334559 A1 | 12/2013 | Vdovin et al. | |
| 2014/0160434 A1* | 6/2014 | Brown, Jr. | A61B 3/0025 351/210 |
| 2015/0070273 A1* | 3/2015 | He | G06F 3/013 345/156 |
| 2015/0242680 A1* | 8/2015 | Thukral | G06F 3/013 348/78 |
| 2016/0014121 A1* | 1/2016 | Perna | G07C 9/37 726/4 |
| 2016/0044253 A1* | 2/2016 | Dainty | G02B 13/004 348/349 |
| 2016/0092731 A1* | 3/2016 | Dainty | G02B 13/004 348/78 |
| 2016/0133201 A1* | 5/2016 | Border | G06K 9/2018 345/694 |
| 2017/0112376 A1* | 4/2017 | Gill | A61B 3/14 |
| 2017/0123526 A1* | 5/2017 | Trail | A61B 3/113 |
| 2017/0161578 A1* | 6/2017 | Ivanisov | G06V 40/40 |
| 2017/0177935 A1* | 6/2017 | Weller | B60R 1/12 |
| 2017/0316266 A1* | 11/2017 | Kawabata | G06V 40/19 |
| 2017/0329138 A1* | 11/2017 | Haddick | H04N 5/2256 |
| 2017/0366761 A1* | 12/2017 | Dainty | G06K 9/00597 |
| 2018/0003919 A1* | 1/2018 | Song | G02B 27/028 |
| 2018/0140187 A1* | 5/2018 | Watanabe | G06K 9/00604 |
| 2018/0164880 A1* | 6/2018 | Kim | G02B 27/0172 |
| 2018/0205943 A1* | 7/2018 | Trail | H04N 13/254 |
| 2019/0019025 A1* | 1/2019 | Yamazaki | G06F 21/32 |
| 2019/0025590 A1* | 1/2019 | Haddick | G02B 27/141 |
| 2019/0042842 A1* | 2/2019 | Cavin | G06T 7/74 |
| 2019/0079581 A1* | 3/2019 | Tsurumi | G06K 9/00597 |
| 2019/0165040 A1 | 5/2019 | Dupont et al. | |
| 2019/0172874 A1 | 6/2019 | Lim et al. | |
| 2019/0266399 A1* | 8/2019 | Kanamori | G06K 9/00617 |
| 2019/0302882 A1* | 10/2019 | Blixt | A61B 3/113 |
| 2019/0377191 A1* | 12/2019 | Hughes | G02B 27/0176 |
| 2019/0392724 A1* | 12/2019 | Breed | G09B 7/00 |
| 2020/0084430 A1* | 3/2020 | Kalarn | H04N 5/2254 |

OTHER PUBLICATIONS

U.S. Appl. No. 16/779,269, filed Jan. 31, 2020, Keenan Molner et al.

* cited by examiner

EYE CAMERA SYSTEMS WITH POLARIZED LIGHT

PRIORITY INFORMATION

This application claims benefit of priority of U.S. Provisional Application Ser. No. 62/802,138 entitled "EYE CAMERA SYSTEMS WITH POLARIZED LIGHT" filed Feb. 6, 2019, the content of which is incorporated by reference herein in its entirety.

BACKGROUND

Conventional eye camera systems use non-polarized light, which has several limitations. For example, non-polarized light may result in reflections from eyelashes and eyelids being captured in the images, which may make processing the images of the eye to perform tasks such as iris recognition and eye/gaze tracking more difficult. As another example, when glints from the illumination sources fall into the iris region, the region may saturate and thus may not be useful for iris recognition. As another example, the contrast of iris patterns (the contrast between different regions of the iris) may be low for some eyes.

Virtual reality (VR) allows users to experience and/or interact with an immersive artificial environment, such that the user feels as if they were physically in that environment. For example, virtual reality systems may display stereoscopic scenes to users in order to create an illusion of depth, and a computer may adjust the scene content in real-time to provide the illusion of the user moving within the scene. When the user views images through a virtual reality system, the user may thus feel as if they are moving within the scenes from a first-person point of view. Similarly, mixed reality (MR) or augmented reality (AR) systems combine computer generated information (referred to as virtual content) with real world images or a real world view to augment, or add content to, a user's view of the world. The simulated environments of VR and/or the mixed environments of MR may thus be utilized to provide an interactive user experience for multiple applications, such as applications that add virtual content to a real-time view of the viewer's environment, interacting with virtual training environments, gaming, remotely controlling drones or other mechanical systems, viewing digital media content, interacting with the Internet, or the like.

SUMMARY

Various embodiments of methods and apparatus for using polarized infrared (IR) light to improve eye-related functions such as iris recognition are described. As an example, a head-mounted display (HMD) may include an eye camera system that includes one or more IR cameras that capture images of the user's eyes that are processed to perform iris recognition, gaze tracking, or other eye-related functions. In embodiments, at least one light polarizing element may be located in the path of the light which is used to capture images of the user's eye (or other facial features). In some embodiments, the user's eye may be illuminated by IR light emitted by one or more LEDs of the HMD. In some embodiments, at least one of the LEDs may be an LED package with an optical filter or filters as described herein. In some embodiments, at least one polarizer (e.g., polarizing filter) may be located at the eye camera sensor, in the eye camera optics, or as or in an additional optical element located on the light path between the eye camera and the user's eye.

Embodiments of the eye camera system may improve the performance of eye-related functions of the HMD including but not limited to iris recognition and eye/gaze tracking through the use of polarized light. Conventional eye camera systems use non-polarized light, which has limitations. For example, non-polarized light may result in reflections from eyelashes and eyelids being captured in the images, which may make iris recognition and eye/gaze tracking more difficult. For users with contact lenses or a smooth corneas, strong reflections of eyelash and eyelid may prevent the iris recognition and/or eye/gaze tracking from working properly. As another example, when glints from the illumination sources (e.g., from non-polarized LEDs) fall into the iris region, the region may saturate and thus may not be useful for iris recognition. As another example, the contrast of iris patterns (the contrast between different regions of the iris) may be low for some eyes. Using polarized light in the eye camera system may overcome these and other limitations of using non-polarized light by reducing or eliminating reflections, reducing or eliminating glints, and/or improving contrast in the iris region.

Figure 1A:
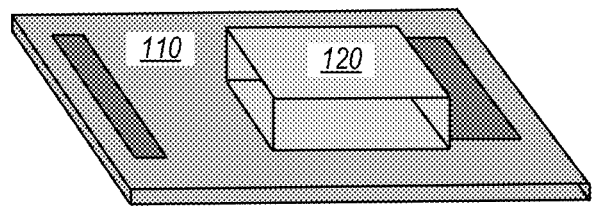
FIGS. 1A through 1E graphically illustrate a method for manufacturing light-emitting diodes (LEDs) with optical filters such as polarizing filters, according to some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the claims, this term does not foreclose additional structure or steps. Consider a claim that recites: "An apparatus comprising one or more processor units. . . ." Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112, paragraph (f), for that unit/circuit/component. Additionally, "configured to" can include generic structure (e.g., generic circuitry) that is manipulated by software or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On" or "Dependent On." As used herein, these terms are used to describe one or more factors that affect a determination. These terms do not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

"Or." When used in the claims, the term "or" is used as an inclusive or and not as an exclusive or. For example, the phrase "at least one of x, y, or z" means any one of x, y, and z, as well as any combination thereof.

DETAILED DESCRIPTION

Various embodiments of methods and apparatus for providing polarized light-emitting diodes (LEDs) are described. Conventional LED packaging is agnostic to polarization, and all mixed polarization states present in the emitted photons are emitted from the packaged LED. Embodiments of a fabrication process for packaging LEDs that include polarizing or wavefront-altering optical components are described in which additional optical components (e.g., a polarization filter applied as a film on top of the encapsulant) are added to the LED package in the packaging stackup to filter or modify the polarization of the emitted photons. Embodiments of packaged LEDs that include polarizing or wavefront-altering optical components are also described. In some embodiments, the packaged LEDs may emit infrared light that is polarized or otherwise altered by the optical components added during the fabrication process. However, packaged LEDs that emit light in the visible or other portions of the spectrum are also possible.

Various embodiments of methods and apparatus for illuminating a user's eyes with polarized infrared (IR) light to improve eye-related functions such as iris recognition are also described. The methods and apparatus may, for example, be used in in a head-mounted display (HMD). The HMD may, for example, be an augmented reality (AR) or virtual reality (VR) HMD that includes one or more IR cameras that capture images of the user's eyes that are processed to perform iris recognition, eye/gaze tracking, or other eye-related functions.

Packaged Light-Emitting Diodes (LEDs) with Optical Filters

FIGS. 1A through 1E graphically illustrate a method for manufacturing light-emitting diodes (LEDs) with optical filters such as polarizing filters, according to some embodiments. In this example, a linear polarizer is added to the LED. However, a similar process may be used to add other types of filters to the LED.

Figure 1B:
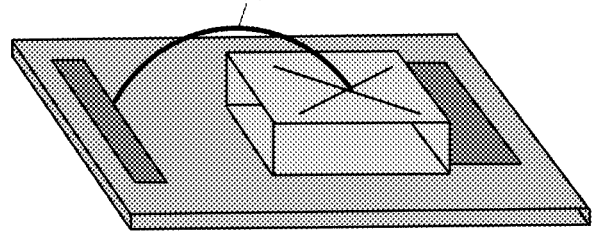
Figure 1C:
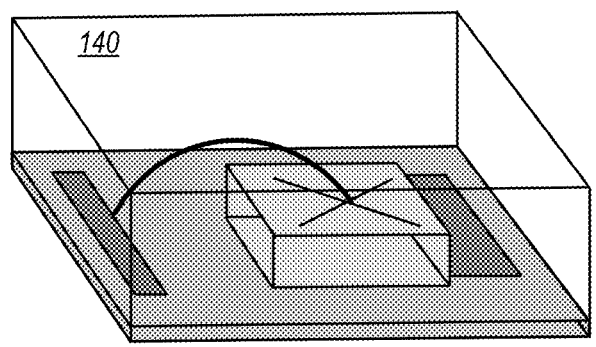

In FIG. 1A, an LED die 120 is attached to a substrate 110. In some embodiments, die 120 may be an AlGaInP diode, and substrate 110 may be a GaAs substrate. In some embodiments, the die 120 may be attached to an Al or Cu heat sync and lead frame. In FIG. 1B, a wire bond 130 (e.g., a gold wire bond) is formed between the substrate 110 and the die 120. In FIG. 1C, the LED die 120 on substrate 110 is overmolded with an encapsulant 140, for example a clear epoxy material. Note, however, that the materials used in the LED die 120, substrate 110, bond 130, and encapsulant 140 are given by way of example, and are not intended to be limiting. Other types of LED dies 120, substrates 110, bonds 130, and encapsulants 140 may be used.

Figure 1D:
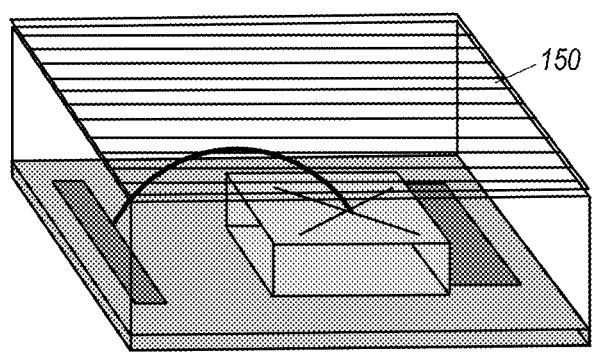

In FIG. 1D, an optical filter 150 (e.g., a linear polarizing filter) is applied to the top surface of encapsulant 140 as a laminate. The filter 150 may, for example, be a film composed of a tungsten wire grid on a silicone substrate. Alternatively, the filter 150 may be a dichroic polarizing film. In some embodiments, other wire materials and/or other organic or inorganic substrate materials may be used. The type of polarizing and substrate materials selected for the filter laminate layer may depend on the particular application for the LED package. For example, in fabrication processes that require the LED package to be passed through a reflow oven, the filter laminate layer should be able to withstand a temperature of ~260° Celsius (C).

Figure 1E:
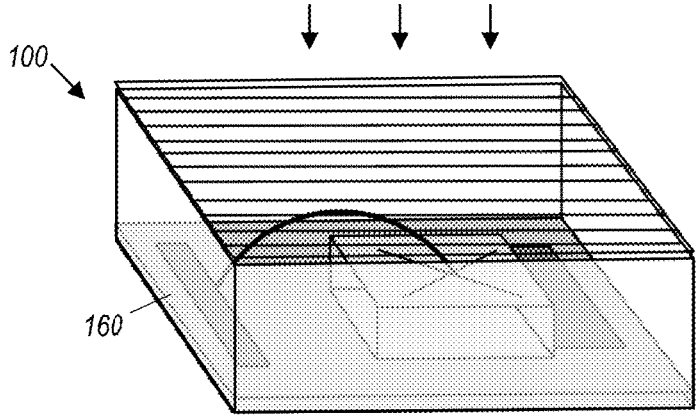

In FIG. 1E, the side walls of the encapsulant 140 are masked with a reflector 160 (e.g., a reflective film, for example with a white inner surface) to provide efficient recycling of light. The top surface of the encapsulant 140 on which the optical filter 160 is laminated is the light-emitting surface. Photons emitted by the LED 120 that strike the reflector 160 may be reflected through the top surface of the encapsulant 140, and thus are polarized by the filter 150. Adding the reflector 160 insures that all light that is emitted by the LED package 100 is polarized, and also increases the amount of light that is emitted through the top surface when compared to an LED without a reflector 160 on the sides of the encapsulant 140. In some embodiments, the reflector 160 film may also serve to overwrap the edges of the optical filter 150 to help secure the filter 150 laminate to the LED package 100.

Figure 2A:
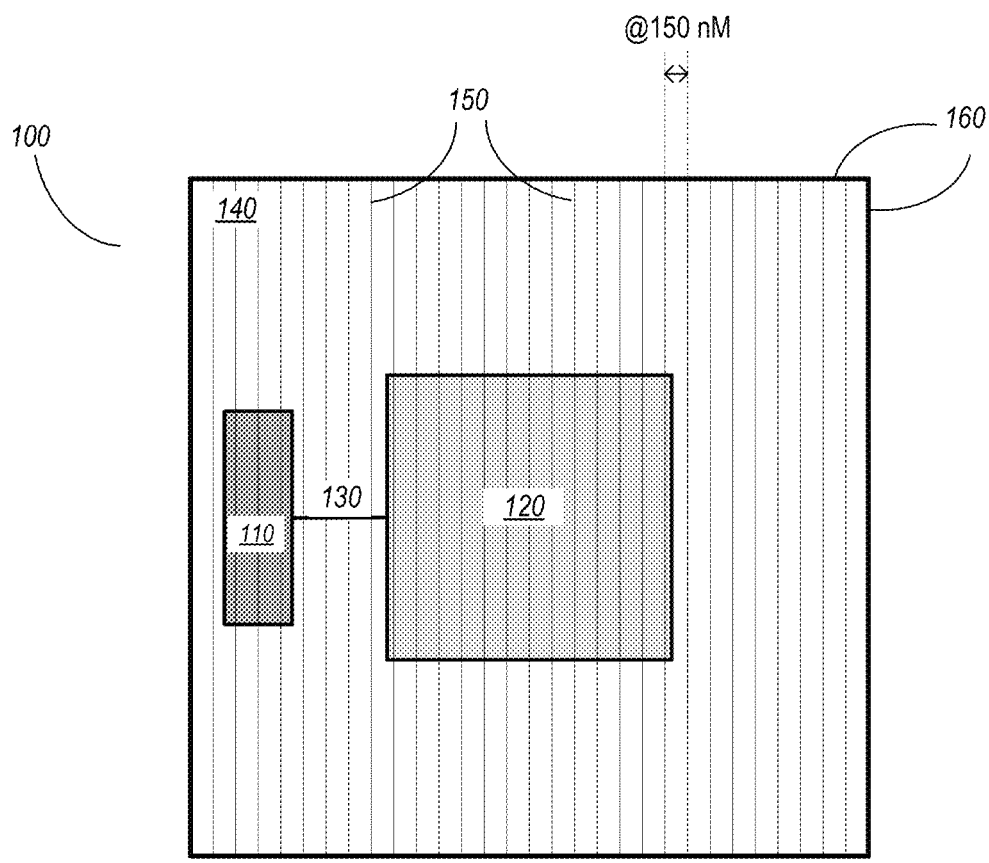
FIGS. 2A and 2B illustrate an example polarized LED produced by the manufacturing method of FIGS. 1A through 1E, according to some embodiments.
Figure 2B:
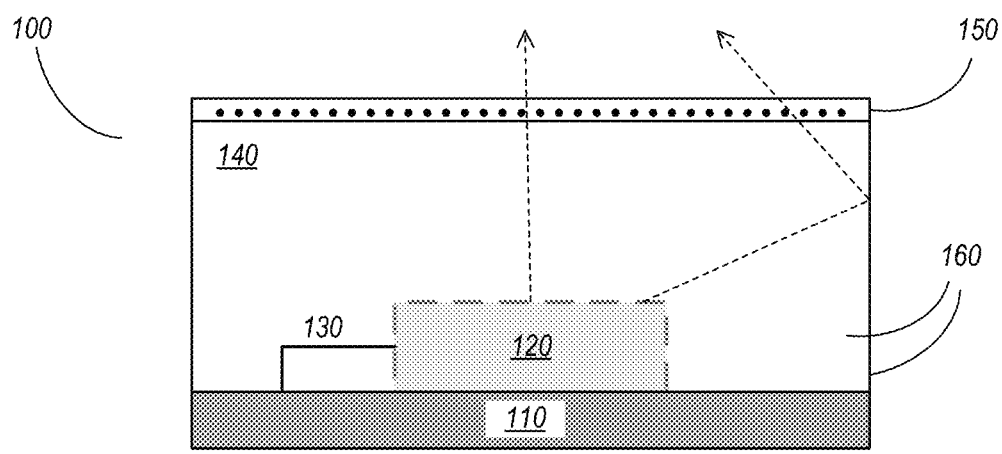

FIGS. 2A and 2B illustrate an example polarized LED package 100 produced by the manufacturing method of FIGS. 1A through 1E, according to some embodiments. FIG. 2A shows a top view of the example polarized LED package 100, and FIG. 2B shows a side view of the example polarized LED package 100. In this example, a linear polarizer 140 is laminated on the top surface of the LED package 100. However, other types of filters may be laminated on the top surface of the LED package 100.

LED package 100 includes an LED die 120 attached to a substrate 110. A wire bond 130 (e.g., a gold wire bond) connects the substrate 110 to the die 120. The LED die 120 on substrate 110 is overmolded with an encapsulant 140, for example an epoxy encapsulant. An optical filter 150 (e.g., a linear polarizing filter) is laminated on the top surface of encapsulant 140. The filter 150 may, for example, be a film composed of a tungsten wire grid on a silicone substrate. However, other types of wires and/or substrate materials may be used. In some embodiments, distance between the wires in filter 150 may be at or about 150 nanometers (nM). The side walls of the encapsulant 140 are masked with a reflector 160 (e.g., a reflective film, for example with a white inner surface) to provide efficient recycling of light.

As shown in FIG. 2B, the top surface of the encapsulant 140 on which the optical filter 160 is laminated is the light-emitting surface. Photons emitted by the LED 120 that strike the reflector 160 may be reflected through the top surface of the encapsulant 140, and thus are polarized by the filter 150. Adding the reflector 160 insures that all light that is emitted by the LED package 100 is polarized, and also increases the amount of light that is emitted through the top surface when compared to an LED without a reflector 160 on the sides of the encapsulant 140. In some embodiments, the reflector 160 film may also serve to overwrap the edges of the optical filter 150 to help secure the filter 150 laminate to the LED package 100.

Figure 3:
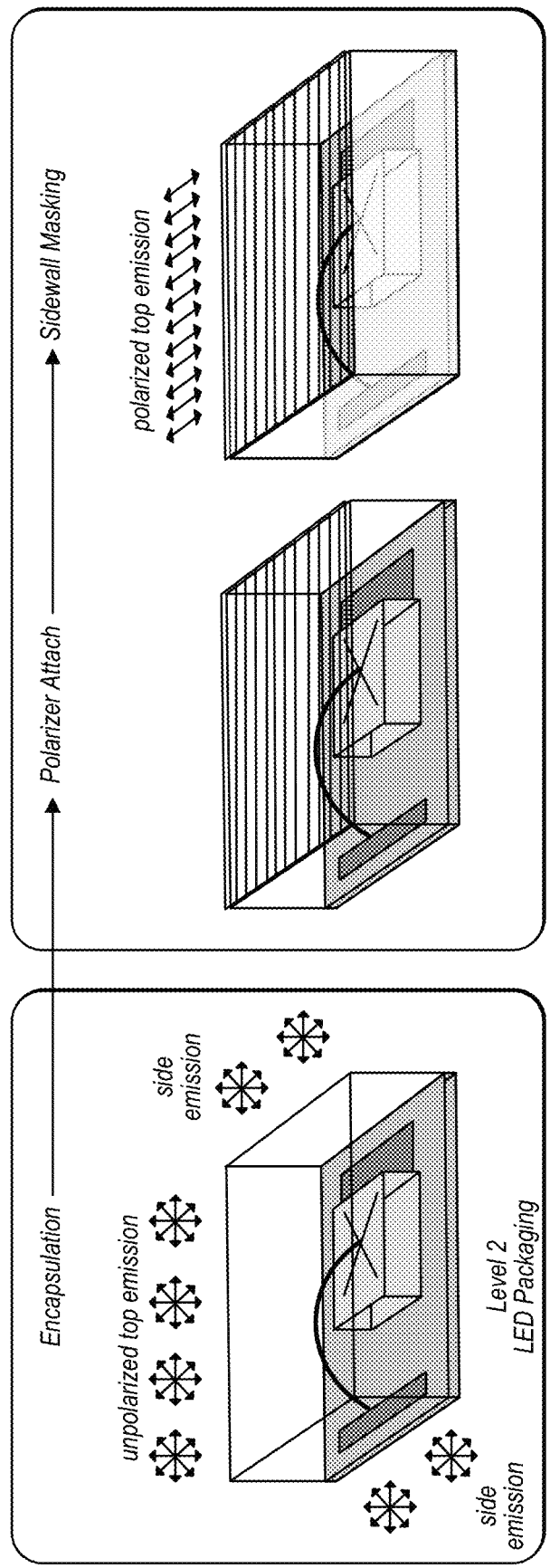
FIG. 3 illustrates a method for manufacturing a linear polarized LED with sidewall masking, according to some embodiments.

FIG. 3 illustrates a method for manufacturing a linear polarized LED with sidewall masking, according to some embodiments. In Level 2 LED packaging, an LED die is attached to a substrate. A wire bond (e.g., a gold wire bond) is formed between the substrate and the LED die. The LED die on the substrate is then overmolded with an encapsulant, for example an epoxy material. Level 2 fabrication produces a conventional LED package that is agnostic to polarization, and all mixed polarization states present in the emitted photons are emitted from the top and sides of the packaged LED.

To provide linear polarized light, an optical filter (e.g., a linear polarizing filter) is attached to the top surface of the encapsulant. The filter may, for example, be a film composed of a tungsten wire grid on a silicone substrate. To prevent emission of unpolarized light through the sides of the encapsulant, the side walls of the encapsulant are masked with a reflector (e.g., a reflective film, for example with a white inner surface). Photons emitted by the LED that strike the reflector may be reflected through the top surface of the encapsulant, and thus are polarized by the filter. Adding the reflector insures that all light that is emitted by the LED package is polarized, and also increases the amount of light that is emitted through the top surface when compared to an LED without a reflector on the sides of the encapsulant. In some embodiments, the reflector film may also serve to overwrap the edges of the optical filter to help secure the filter laminate to the LED package.

Figure 4:
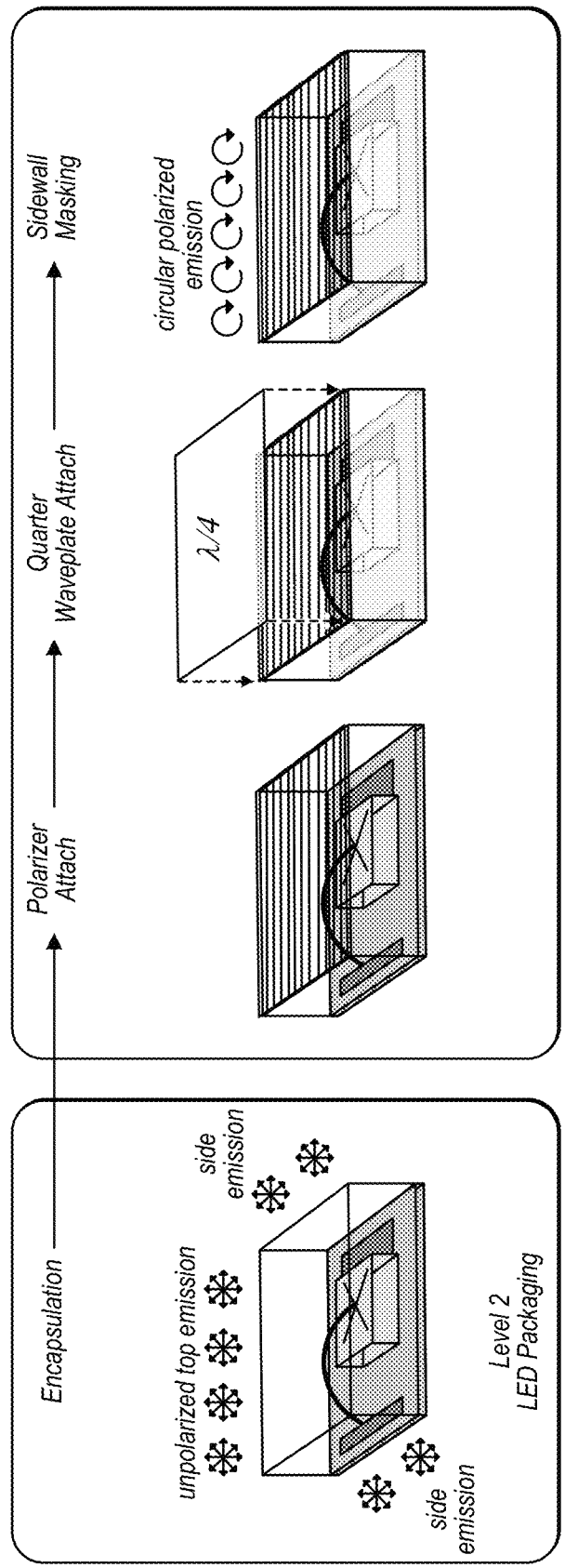
FIG. 4 illustrates a method for manufacturing an LED with a linear polarizer and quarter waveplate to achieve a circular polarization state of emission, according to some embodiments.

FIG. 4 illustrates a method for manufacturing an LED with a linear polarizer and quarter waveplate to achieve a circular polarization state of emission, according to some embodiments. The Level 2 fabrication process may be the same as described in reference to FIG. 3. To provide circular polarized light, an optical filter (e.g., a linear polarizing filter) is attached to the top surface of the encapsulant. The filter may, for example, be a film composed of a tungsten wire grid on a silicone substrate. A quarter waveplate film or layer is then added on top of the linear polarizer layer to induce a circular polarization state for emitted light. To prevent emission of unpolarized light through the sides of the encapsulant, the side walls of the encapsulant are masked with a reflector (e.g., a reflective film, for example with a white inner surface. Photons emitted by the LED that strike the reflector may be reflected through the top surface of the encapsulant, and thus are polarized by the filter layers. Adding the reflector insures that all light that is emitted by the LED package is polarized, and also increases the amount of light that is emitted through the top surface when compared to an LED without a reflector on the sides of the encapsulant. In some embodiments, the reflector film may also serve to overwrap the edges of the optical filter layers to help secure the filter laminates to the LED package.

Figure 5:
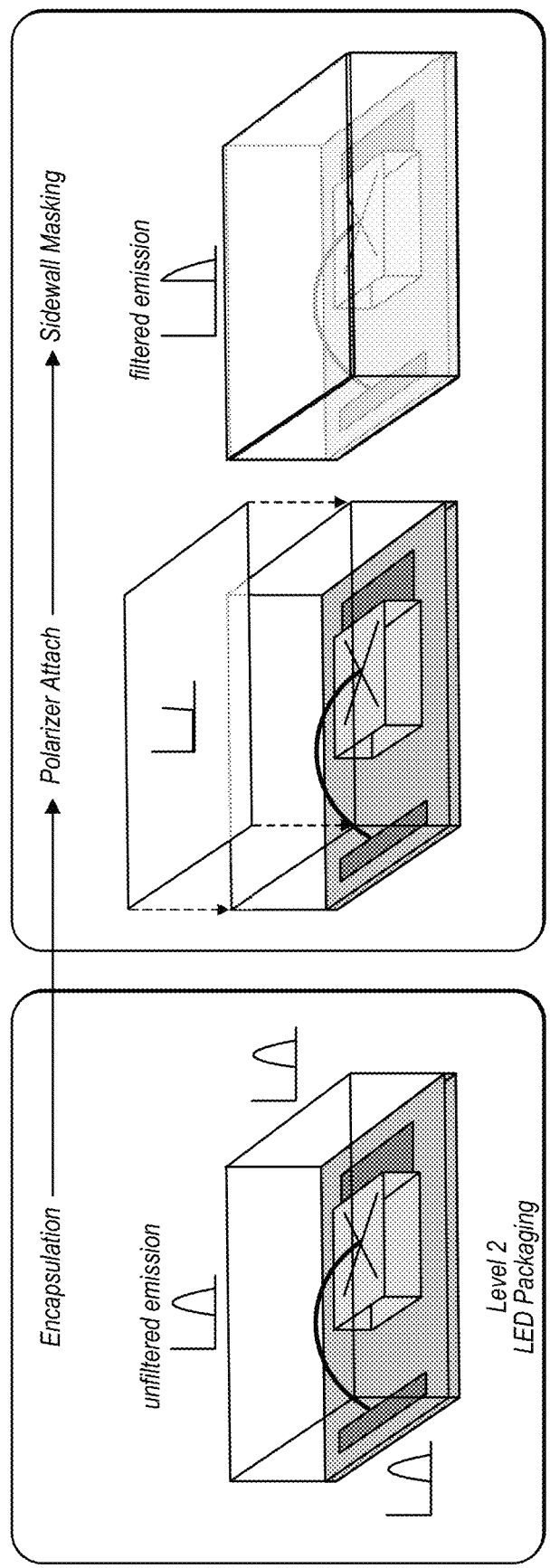
FIG. 5 illustrates a method for manufacturing an LED with a high-pass optical filter, according to some embodiments.

FIG. 5 illustrates a method for manufacturing an LED with a high-pass optical filter, according to some embodiments. The Level 2 fabrication process may be the same as described in reference to FIG. 3. To provide filtered emissions of light, a high-pass filter is attached to the top surface of the encapsulant. To prevent emission of unpolarized light through the sides of the encapsulant, the side walls of the encapsulant are masked with a reflector (e.g., a reflective film, for example with a white inner surface. Photons emitted by the LED that strike the reflector may be reflected through the top surface of the encapsulant, and thus are polarized by the filter layers. Adding the reflector insures that all light that is emitted by the LED package is polarized, and also increases the amount of light that is emitted through the top surface when compared to an LED without a reflector on the sides of the encapsulant. In some embodiments, the reflector film may also serve to overwrap the edges of the optical filter layers to help secure the filter laminates to the LED package.

Figure 6:
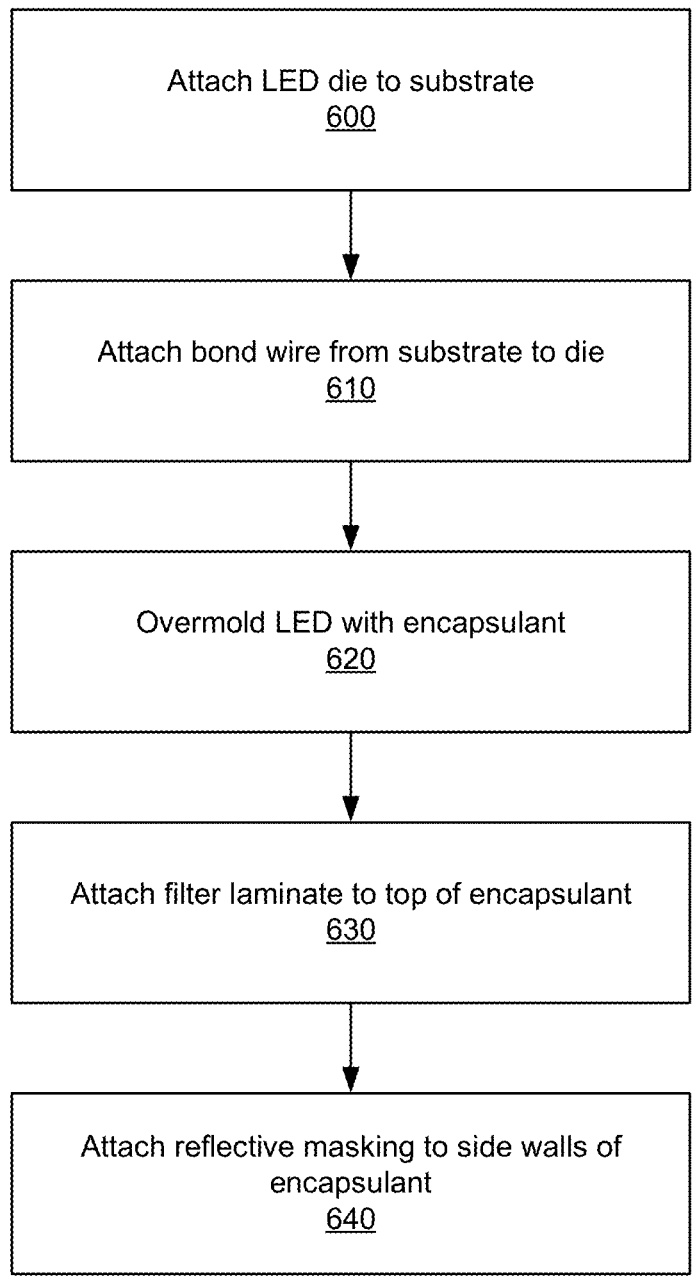
FIG. 6 is a high-level flowchart of a method for manufacturing an LED with optical filter(s), according to some embodiments.

FIG. 6 is a high-level flowchart of a method for manufacturing an LED with optical filter(s), according to some embodiments. As indicated at 600, an LED die 120 is attached to a substrate 110. As indicated at 610, a wire bond 130 (e.g., a gold wire bond) is formed between the substrate 110 and the die 120. As indicated at 620, the LED die 120 on substrate 110 is overmolded with an encapsulant 140, for example an epoxy material.

As indicated at 630, an optical filter 150 (e.g., a linear polarizing filter) is applied to the top surface of encapsulant 140 as a laminate. The filter 150 may, for example, be a film composed of a tungsten wire grid on a silicone substrate. Alternatively, the filter 150 may be a dichroic polarizing film. In some embodiments, other wire materials and/or other organic or inorganic substrate materials may be used. The type of light-affecting and substrate materials selected for the filter laminate layer may depend on the particular application for the LED package. For example, in fabrication processes that require the LED package to be passed through a reflow oven, the filter laminate layer should be able to withstand a temperature of ~260° Celsius (C).

In some embodiments, a linearly polarized filter may be attached to the top surface of the LED package. In some embodiments, a linear polarizer and a quarter wave plate may be attached to the top surface of the LED package to achieve circular polarized emission. In some embodiments, the spectra of the emission may be filtered using a high-wavelength pass optical filter attached to the top surface of the LED package. In some embodiments, a single polarization filter may be attached to the top surface of the LED package during the fabrication process. In some embodiments, multiple polarizing elements may be attached to the top surface of the LED package during the fabrication process, for example, two or more of quarter wave plates, optically clear adhesives, absorptive polarizers, reflective polarizers, etc. In some embodiments, wavelength selective filters (interference coatings) may be attached to the top surface of the LED package during the fabrication process. In some embodiments, birefringent materials may be attached to the top surface of the LED package during the fabrication process. In some embodiments, polarizers with weak extinction ratios may be attached to the top surface of the LED package during the fabrication process to create partially polarized light.

As indicated at 640, the side walls of the encapsulant 140 are masked with a reflector 160 (e.g., a reflective film, for example with a white inner surface) to provide efficient recycling of light. The top surface of the encapsulant 140 on which the optical filter 160 is laminated is the light-emitting surface. Photons emitted by the LED 120 that strike the reflector 160 may be reflected through the top surface of the encapsulant 140, and thus are polarized (or otherwise affected) by the filter 150. Adding the reflector 160 insures that all light that is emitted by the LED package 100 is polarized, and also increases the amount of light that is emitted through the top surface when compared to an LED without a reflector 160 on the sides of the encapsulant 140. In some embodiments, the reflector 160 film may also serve to overwrap the edges of the optical filter 150 to help secure the filter 150 laminate to the LED package 100.

Figure 7:
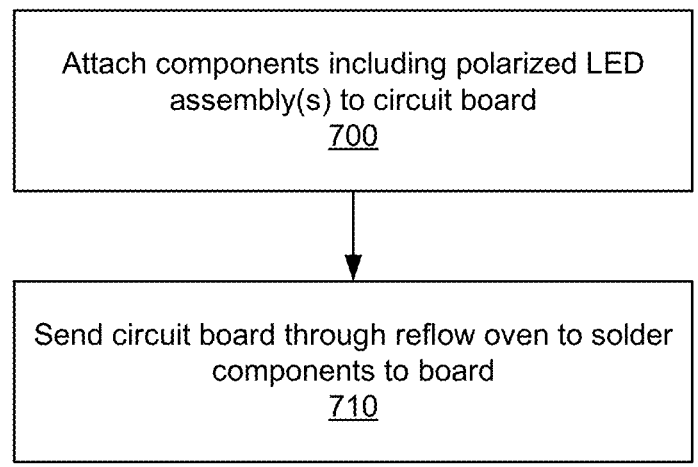
FIG. 7 is a high-level flowchart of a method for manufacturing a circuit board with LEDs that include optical filters, according to some embodiments.

FIG. 7 is a high-level flowchart of a method for manufacturing a circuit board with LEDs that include optical filters, according to some embodiments. As indicated at 700, one or more components, including but not limited to one or more LED packages 100 with optical filters laminated on the top surface of the LED packages, may be attached to a circuit board, for example a flex circuit board. As indicated at 710, in some embodiments, the circuit board may then be sent through a reflow oven to solder the components to the board. In fabrication processes that require the LED packages to be passed through a reflow oven on a circuit board, the filter laminate layer should be able to withstand a temperature of ~260° Celsius (C). As an example, a filter laminate layer composed of tungsten wires on a silicone substrate should be able to withstand the temperature of a reflow oven. However, other substrate materials may instead be used.

An advantage of the LED packaging process described herein is that LED packages with different optical filters (or without filters) may be easily arranged in close proximity to each other on a circuit board. Using conventional LEDs, it would be much more difficult to fabricate a circuit board with multiple LEDs in close proximity that have different polarization or other filters.

An example application of packaged LEDs is in illuminating a user's eyes with IR light in a head-mounted display (HMD), for example an augmented reality (AR) or virtual reality (VR) HMD, as described below.

Eye-Related Camera Systems with Polarized Light

Various embodiments of methods and apparatus for using polarized IR light in a head-mounted display (HMD) to improve eye-related functions such as iris recognition are described. An HMD may include an eye camera system that includes one or more IR cameras that capture images of the user's eyes that are processed to perform iris recognition, eye/gaze tracking, or other eye-related functions. In embodiments, at least one light polarizing element may be located in the path of the light which is used to capture images of the user's eye (or other facial features). In some embodiments, the user's eye may be illuminated by IR light emitted by one or more LEDs of the HMD. In some embodiments, at least one of the LEDs may be an LED package with an optical filter or filters as described herein. In some embodiments, at least one polarizer (e.g., polarizing filter) may be located at the eye camera sensor, in the eye camera optics (e.g., in or in front of a lens system of the camera), or as or in an additional optical element located on the light path between the eye camera and the user's eye.

In some embodiments, a VR/AR device such as a headset, helmet, goggles, or glasses (referred to herein as a head-mounted display (HMD)) may include a display mechanism (e.g., left and right near-eye display panels) for displaying frames including left and right images in front of a user's eyes to thus provide 3D virtual views to the user. The HMD may include left and right optical lenses (referred to herein as eye lenses) located between the display and the user's eyes. For AR applications, the HMD may include or be coupled to one or more external video cameras that capture video of the user's environment for display. The HMD may include a controller component that may, for example, render frames for display to the left and right displays. Alternatively, the controller component may be implemented by an external device that is coupled to the HMD via a wired or wireless connection.

An eye-related camera system may be included in the HMD for capturing images of the user's eyes for use in performing one or more functions including but not limited to iris recognition and eye/gaze tracking (detecting position and movement of the user's eyes). The eye camera system may include at least one eye camera (e.g., infrared (IR) cameras) positioned at each side of the user's face, and illumination sources (e.g., IR light sources such as an array or ring of LEDs) that emit light (e.g., IR light) towards the user's eyes. The eye tracking cameras may be pointed towards the user's eyes to receive reflected IR light from the light sources directly from the eyes, or alternatively may be pointed towards "hot" mirrors located between the user's eyes and the display panels that reflect IR light from the eyes to the eye tracking cameras while allowing visible light to pass. The eye camera system may capture images of the user's eyes (e.g., as a video stream captured at 60-120 frames per second (fps)). The images captured by the eye camera system may be analyzed to perform iris recognition, to generate eye/gaze tracking information, or to perform other eye-related functions, for example by the controller component of the VR/AR system. In embodiments, to improve the performance of iris recognition, eye/gaze tracking, or other eye-related functions, at least one light polarizing element may be located in the path of the light which is used to capture images of the user's eye.

In some embodiments, at least one of the LEDs that illuminate the user's eyes may be a polarizing LED package as described herein that emits polarized IR light to improve eye-related functions such as iris recognition. In some embodiments, at least one of the LEDs that illuminate the user's eyes may be an LED with a linearly polarized filter attached to the top surface of the LED package. In some embodiments, at least one of the LEDs that illuminate the user's eyes may be an LED with a linear polarizer and a quarter wave plate attached to the top surface of the LED package to achieve circular polarized emission. In some embodiments, at least one of the LEDs that illuminate the user's eyes may be an LED with a high-wavelength pass optical filter attached to the top surface of the LED package. In some embodiments, at least one of the LEDs that illuminate the user's eyes may be an LED with a single polarization filter attached to the top surface of the LED package. In some embodiments, at least one of the LEDs that illuminate the user's eyes may be an LED with multiple polarizing elements attached to the top surface of the LED package, for example two or more of quarter wave plates, optically clear adhesives, absorptive polarizers, reflective polarizers, etc. In some embodiments, at least one of the LEDs that illuminate the user's eyes may be an LED with wavelength selective filters (interference coatings) attached to the top surface of the LED package. In some embodiments, at least one of the LEDs that illuminate the user's eyes may be an LED with birefringent materials attached to the top surface of the LED package. In some embodiments, at least one of the LEDs that illuminate the user's eyes may be an LED with polarizers with weak extinction ratios attached to the top surface of the LED package to create partially polarized light.

In some embodiments, instead of or in addition to the polarized LED package(s) used to illuminate the eye with polarized light, at least one polarizer element (e.g., polarizing filter) may be located at the eye camera sensor, in the eye camera optics, or as or in an additional optical element located on the light path between the eye camera and the user's eye. The polarizer may, for example, be used to filter one or more polarization states/directions depending on the particular implementation, configuration, and setup of the eye camera system.

While embodiments of an eye camera system for an HMD are generally described herein that include at least one eye camera positioned at each side of the user's face to capture images of both of the user's eyes, an eye camera system for HMDs may also be implemented that includes at least one eye tracking camera positioned at only one side of the user's face to capture images of only one of the user's eyes.

Embodiments of the eye camera system may improve the performance of eye-related functions of the HMD including but not limited to iris recognition and eye/gaze tracking through the use of polarized light. Conventional eye camera systems use non-polarized light, which has limitations. For example, non-polarized light may result in reflections from eyelashes and eyelids being captured in the images, which may make iris recognition and eye/gaze tracking more difficult. For users with contact lenses or a smooth corneas, strong reflections of eyelash and eyelid may prevent the iris recognition and/or eye/gaze tracking from working properly. As another example, when glints from the illumination sources (e.g., from non-polarized LEDs) fall into the iris region, the region may saturate and thus may not be useful for iris recognition. As another example, the contrast of iris patterns (the contrast between different regions of the iris) may be low for some eyes. Using polarized light in the eye camera system may overcome these and other limitations of using non-polarized light by reducing or eliminating reflections, reducing or eliminating glints, and/or improving contrast in the iris region.

In some embodiments, the eye camera system may use linearly polarized IR light emitted by one or more linear polarized LEDs to illuminate the eye, and an IR camera without a polarizer to capture images of the eye. In some embodiments, the eye camera system may use non-polarized IR light to illuminate the eye, and an IR camera with a polarizer to capture images of the eye. In some embodiments, the eye camera system may use linearly polarized IR light emitted by one or more linear polarized LEDs to illuminate the eye, and an IR camera with a polarizer to capture images of the eye.

In some embodiments, the HMD may include an eyepiece (e.g., on or more refractive lenses) located in front of the user's eye. In some embodiments, the LEDs and eye camera may be located in front of the eyepiece so that the light emitted by the LEDs passes through the eye piece, reflects off the user's eye, and passes back through the eyepiece to be captured by the eye camera. In some embodiments, the LEDs and eye camera may be located to the side of the eyepiece or between the eyepiece and the eye, so that the light emitted by the LEDs reflects off the user's eye and is captured by the eye camera without passing through the eyepiece. In some embodiments, the LEDs may be located to the side of the eyepiece or between the eyepiece and the eye, and the eye camera may be located in front of the eyepiece so that the light emitted by the LEDs reflects off the user's eye, passes through the eyepiece, and is captured by the eye camera.

In some embodiments, the eye camera system may use linearly polarized light. In some embodiments, the eye camera system may use circularly or elliptically polarized light rather than linearly polarized light. In some embodiments, the eye camera system may use partially polarized light. In some embodiments, the eye camera system may use different polarization orientations rather than vertical and horizontal directions. In some embodiments, the eye camera system may use polarizers with tunable polarization states.

In some embodiments, the eye camera system may capture images with different polarizations at different time(s). For example, the eye camera system may capture a first image with one polarization at a first time and capture a second image with a different polarization at a second time.

In some embodiments, the eye camera system may capture images with different polarizations at the same time. For example, the eye camera system may capture multiple polarizations separated by different polarizers in one image.

In some embodiments, a camera system may use light polarization for images captured of other regions of the user's eyes and face than the iris, including but not limited to the iris and pupil, sclera, eyelashes, eyelids, facial skin, and eyebrows.

The eye camera system and/or the controller of the HMD may implement various methods for processing images of the eye captured by the eye camera system, for example iris recognition and eye/gaze tracking methods. Embodiments of the eye camera system may use polarized light when capturing images for use the in one or more of the eye-related methods. Using polarized light may provide improved performance in the eye-related methods, including but not limited to iris recognition. Some embodiments may use polarized light when capturing images of the eye to reduce eyelash and eyelid reflections. Some embodiments may use polarized light when capturing images of the eye to reduce reflections due to contact lenses. Some embodiments may use polarized light when capturing images of the eye to reduce the saturation region due to specular reflection caused by the LEDs. Some embodiments may use polarized light when capturing images of the eye to enhance contrast of different regions of the eye. Some embodiments may use polarized light when capturing images of the eye to enhance pupil boundary detection. Some embodiments may use polarized light when capturing images of the eye to enhance iris-sclera boundary detection. Some embodiments may use polarized light when capturing images of the eye to enhance eyelid boundary detection. Some embodiments may use polarized light when capturing images of the eye to enhance contrast in the iris.

Figure 8:
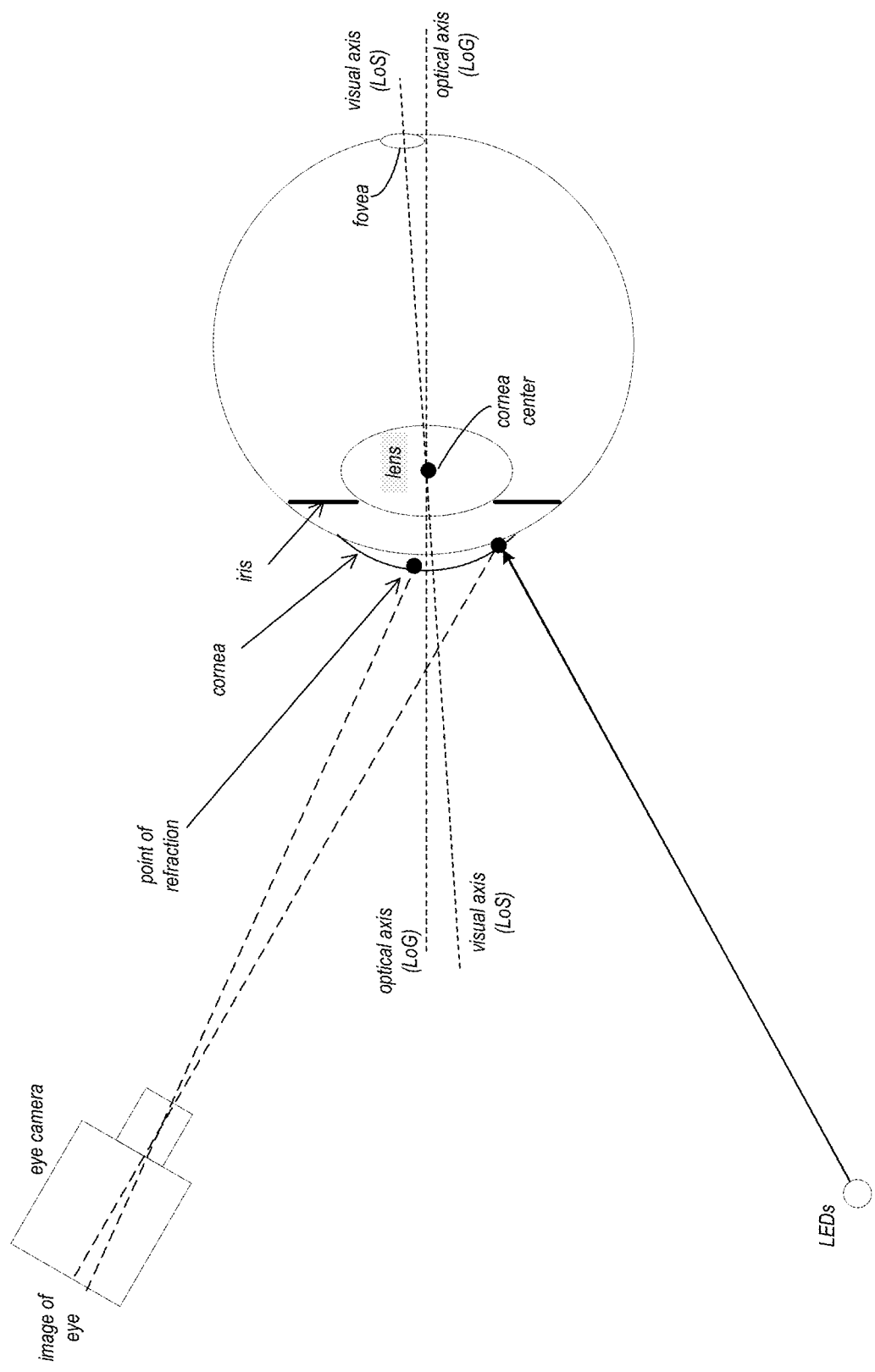
FIG. 8 graphically illustrates an eye camera with LEDs that illuminate the eye, according to some embodiments.

FIG. 8 graphically illustrates an IR eye camera with IR LEDs that illuminate the eye, according to some embodiments. Images of the iris captured by the eye camera may be processed, for example to perform iris recognition to determine if the person wearing the HMD is authorized to use the HMD. Images of the eye captured by the eye camera may instead or also be processed to determine the current visual axis and point of gaze of the user with respect to the display.

The images captured by the cameras may include glints, which are reflections of the IR light sources (e.g., arrays of LEDs) on the surface of the cornea. The images may also include reflections of the user's eyelashes and/or eyelids. In addition, in regions of the images such as the iris, contrast may not be sufficient to efficiently perform functions such as iris recognition. Embodiments may use polarized IR light when capturing images to improve eye-related functions such as iris recognition and eye/gaze tracking. In some embodiments, at least one of the LEDs may be an LED package with a polarizing filter or filters as described herein. In some embodiments, instead of or in addition to the polarized LEDs, at least one polarizer may be located at the eye camera sensor, in the eye camera optics, or as or in an additional optical element located on the light path between the eye camera and the user's eye.

Figure 9A:
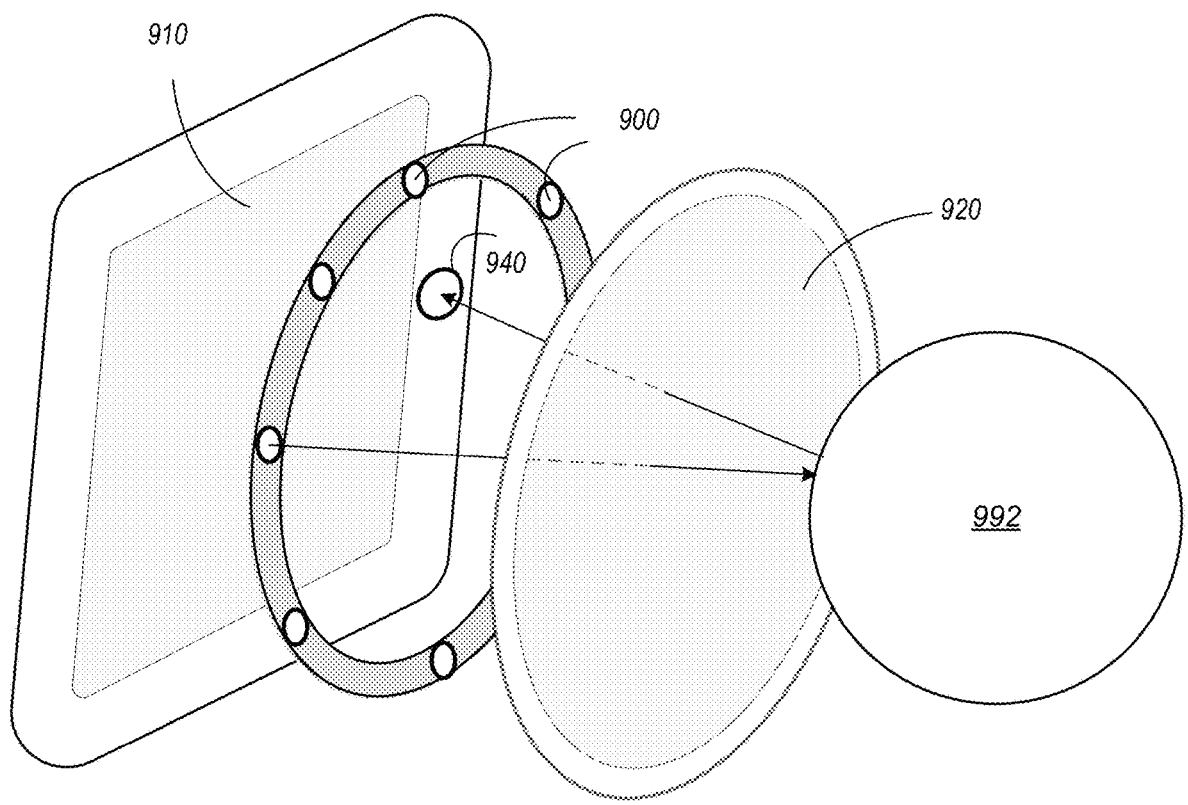
FIGS. 9A and 9B illustrate eye cameras and LEDs in a head-mounted display (HMD), according to some embodiments.
Figure 9B:
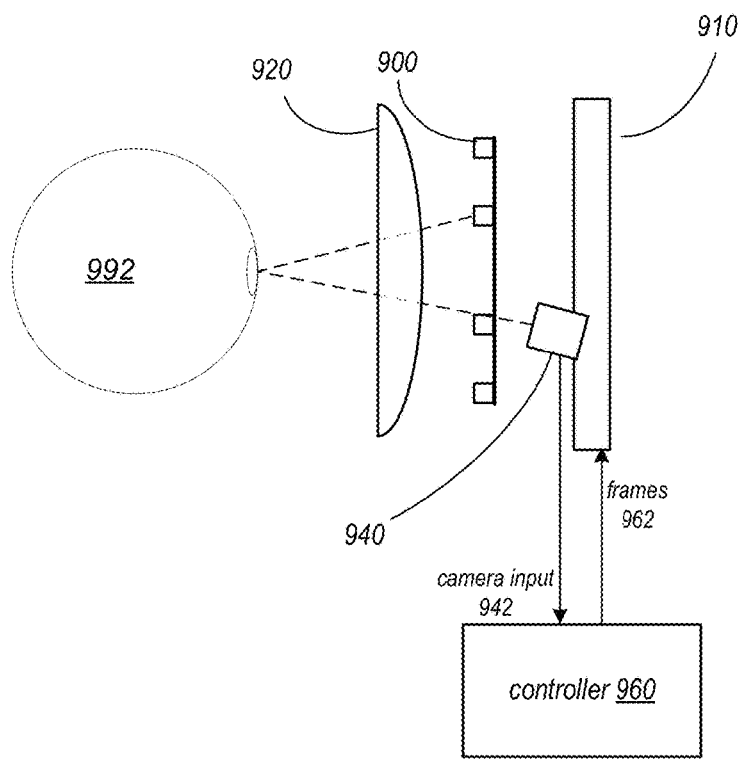

FIGS. 9A and 9B illustrate eye cameras and LEDs in a head-mounted display (HMD), according to some embodiments. FIGS. 9A and 9B illustrate components of an eye camera system in an example HMD in which the eye camera 940 images a reflection of the user's eye 992 through an eyepiece or eye lens 920, and in which the LEDs 900 illuminate the eye 992 through the eye lens 920. However, note that other configurations are possible. For example, the eye camera 940 may image a reflection of the user's eye 992 off of a hot mirror located between eye lens 920 and display 910, or the eye camera 940 may image the user's eye 992 directly. As another example, the LEDs 900 may illuminate the eye 992 directly.

An HMD may include, but is not limited to, a display 910 (e.g., a left and right display panel), two eye lenses 920, and an eye camera system that includes at least one eye camera 940 (e.g., infrared (IR) cameras) positioned at each side of the user's face, and an illumination source 900 (e.g., IR light sources such as an array or ring of IR light-emitting diodes (LEDs)) that emit light (e.g., IR light) towards the user's eyes 992.

As shown in FIG. 9B, the HMD may include a controller 962 that may, for example, render AR or VR frames 962 (e.g., left and right frames for left and right display panels) and provide the frames 962 to the display 910. In some embodiments, the controller 960 may be integrated in the HMD. In some embodiments, at least some of the functionality of the controller 960 may be implemented by a device external to the HMD and coupled to the HMD by a wired or wireless connection. The user looks through the eye lenses 920 onto the display 910 (e.g., on to left and right display panels through left and right lenses 920).

The controller 960 may, for example, use input 942 from the eye cameras 940 for various purposes, for example in processing the frames 962 for display. In some embodiments, the controller 960 may estimate the user's point of gaze on the display 910 based on the input 942 obtained from the eye cameras 940. The point of gaze may be used to determine the direction in which the user is currently looking. As another example, the controller 960 may use input 942 from the eye cameras 940 to perform iris recognition to determine if the person wearing the HMD is authorized to use the HMD.

The images captured by the cameras 940 may include glints, which are reflections of the IR light sources (e.g., arrays of LEDs) on the surface of the cornea. The images may also include reflections of the user's eyelashes and/or eyelids. In addition, in regions of the images such as the iris, contrast may not be sufficient to efficiently perform functions such as iris recognition. Embodiments may use polarized IR light when capturing images to improve eye-related functions such as iris recognition and eye/gaze tracking. In some embodiments, at least one of the LEDs 900 may be an LED package with a polarizing filter or filters as described herein. In some embodiments, instead of or in addition to the polarized LEDs 900, at least one polarizer may be located at the eye camera 940 sensor, in the eye camera 940 optics, or as or in an additional optical element 940 located on the light path between the eye camera 940 and the user's eye 992.

Figure 10A:
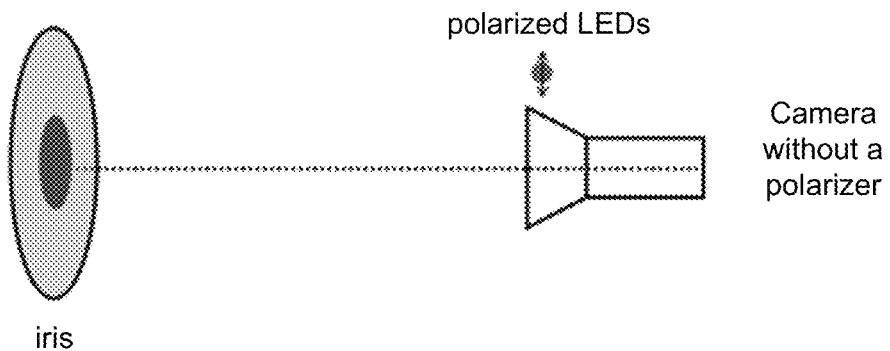
FIG. 10A through 10F illustrate various methods for polarizing light in an iris recognition system, according to some embodiments.
Figure 10B:
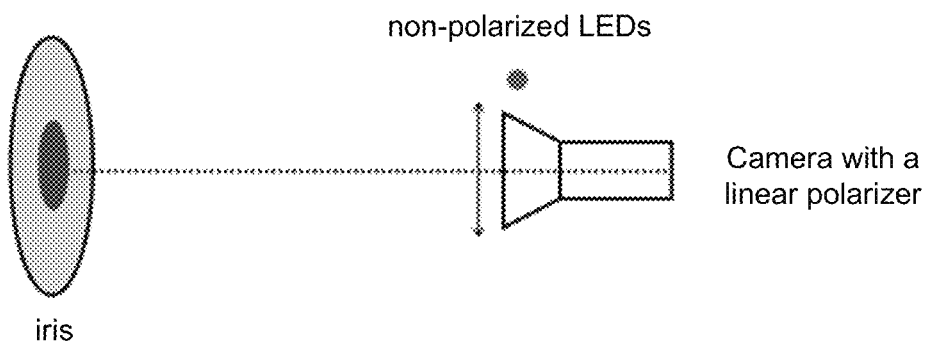
Figure 10C:
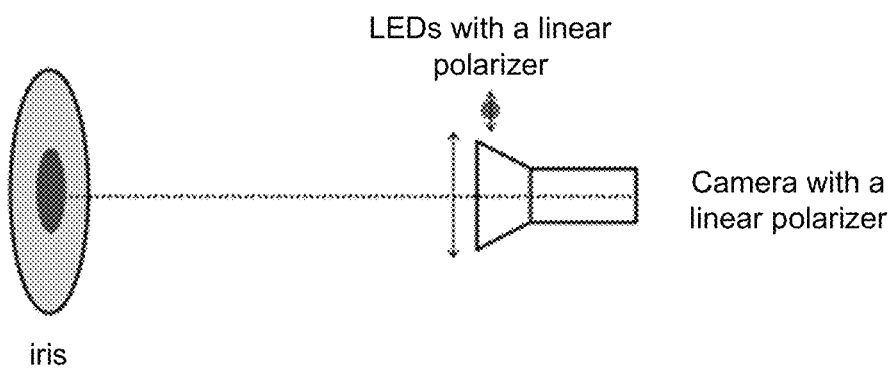

FIG. 10A through 10F illustrate various methods for polarizing light in an iris recognition system, according to some embodiments. As shown in FIG. 10A, in some embodiments, the eye camera system may use linearly polarized IR light emitted by one or more linear polarized LEDs to illuminate the eye, and an IR camera without a polarizer to capture images of the eye. As shown in FIG. 10B, in some embodiments, the eye camera system may use non-polarized IR light to illuminate the eye, and an IR camera with a polarizer to capture images of the eye. As shown in FIG. 10C, in some embodiments, the eye camera system may use linearly polarized IR light emitted by one or more linear polarized LEDs to illuminate the eye, and an IR camera with a polarizer to capture images of the eye.

Figure 10D:
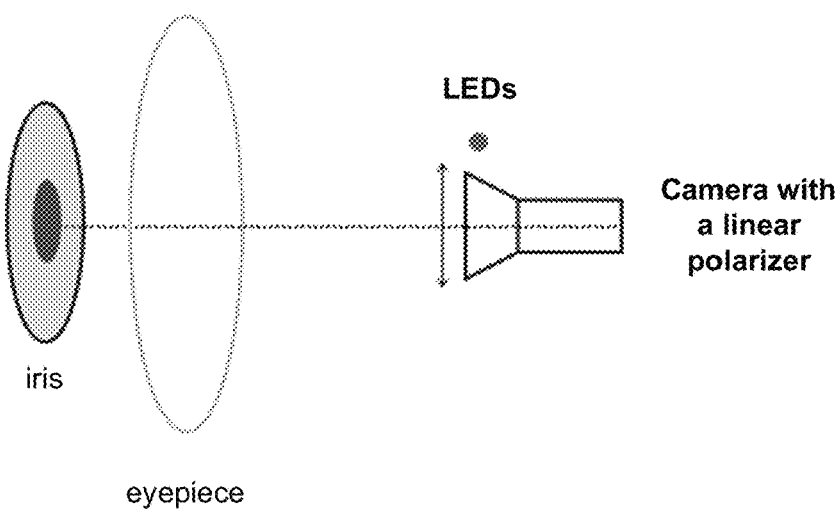
Figure 10E:
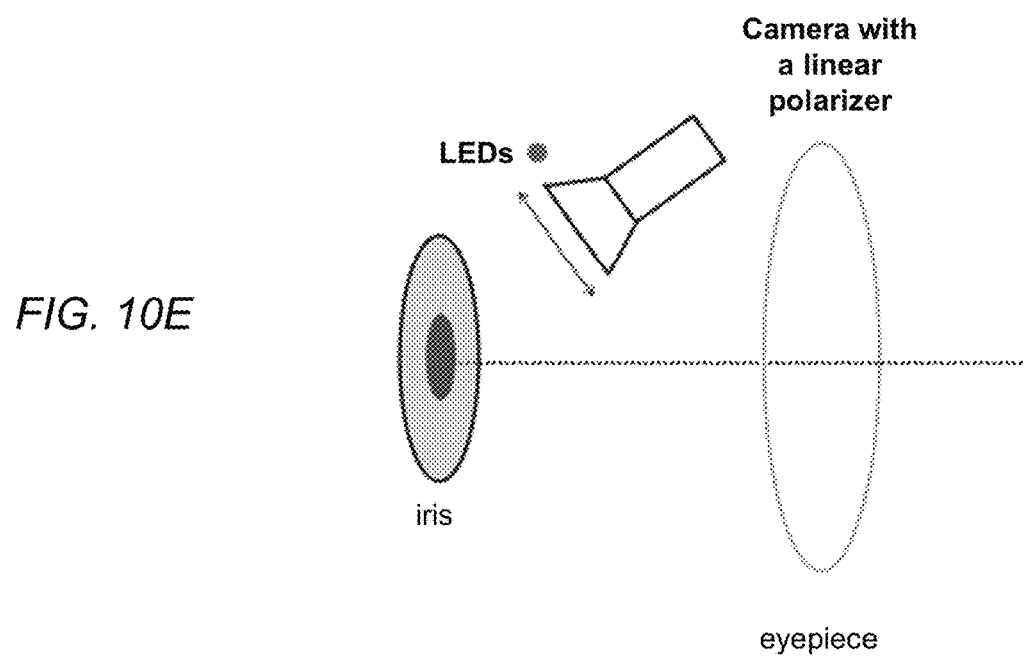
Figure 10F:
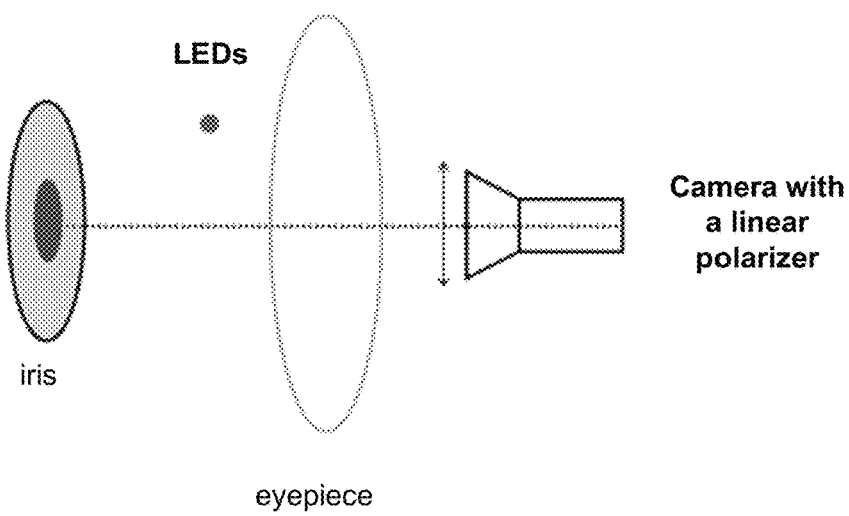

In some embodiments, the HMD may include an eyepiece (e.g., on or more refractive lenses) located in front of the user's eye. As shown in FIG. 10D, in some embodiments, the LEDs and eye camera may be located in front of the eyepiece so that the light emitted by the LEDs passes through the eye piece, reflects off the user's eye, and passes back through the eyepiece to be captured by the eye camera. As shown in FIG. 10E, in some embodiments, the LEDs and eye camera may be located to the side of the eyepiece or between the eyepiece and the eye, so that the light emitted by the LEDs reflects off the user's eye and is captured by the eye camera without passing through the eyepiece. As shown in FIG. 10F, in some embodiments, the LEDs may be located to the side of the eyepiece or between the eyepiece and the eye, and the eye camera may be located in front of the eyepiece so that the light emitted by the LEDs reflects off the user's eye, passes through the eyepiece, and is captured by the eye camera.

Figure 11A:
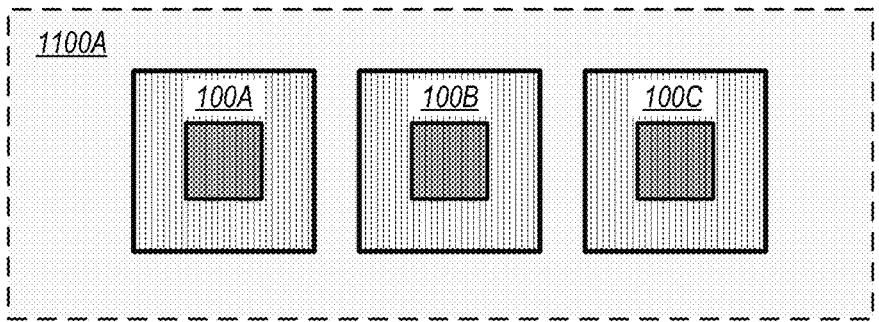
FIGS. 11A through 11D show example configurations for LEDs with optical filters, according to some embodiments.
Figure 11B:
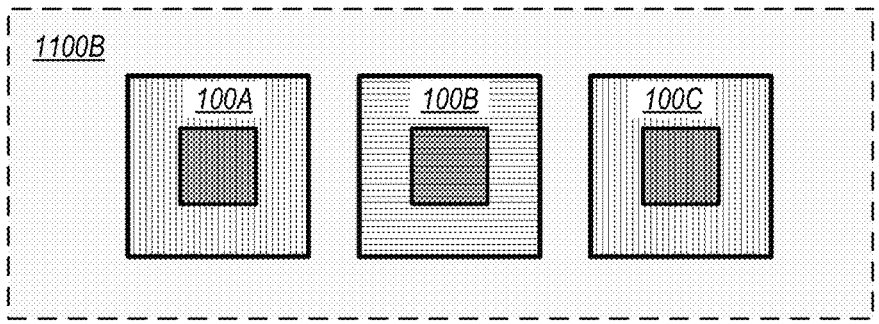
Figure 11C:
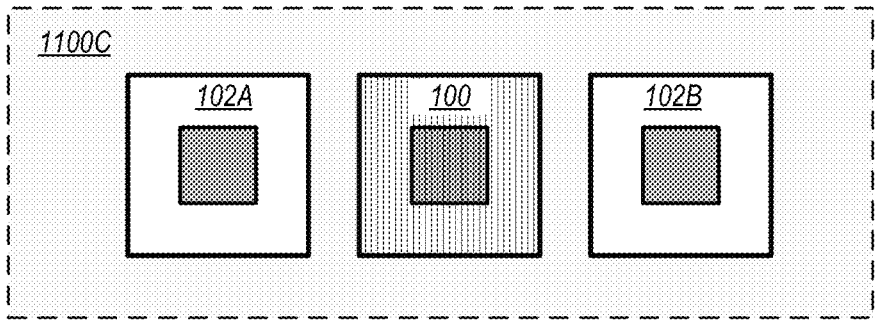
Figure 11D:
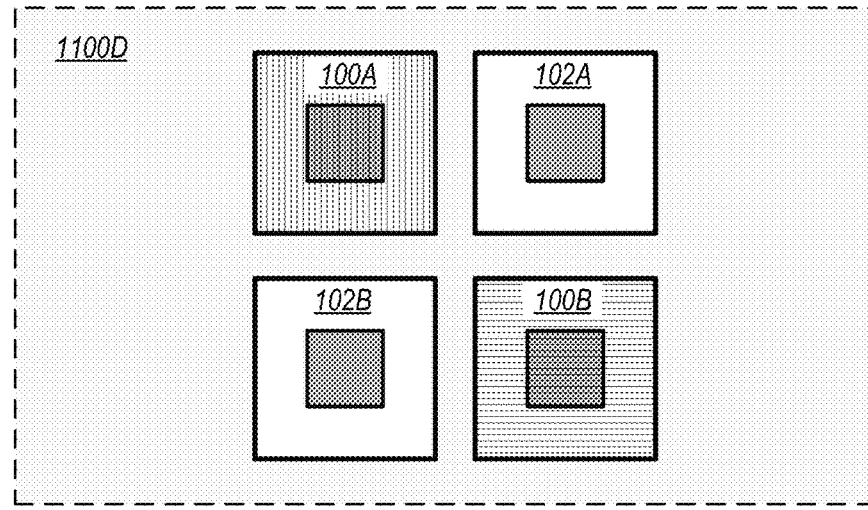

FIGS. 11A through 11D show example configurations for LEDs with optical filters, according to some embodiments. An advantage of the LED packaging process described herein is that LED packages with different optical filters (or without filters) may be easily arranged in close proximity to each other on a circuit board. Using conventional LEDs, it would be much more difficult to fabricate a circuit board with multiple LEDs in close proximity that have different polarization or other filters. Another advantage of the LED packaging process described herein is that integrating the filters (e.g., polarization filters) in the LED packages makes it much easier to control the orientation of polarization relative to the rest of the system. FIG. 11A shows an example in which three LEDs 100A, 100B, and 100C with the same linear polarization are arranged in close proximity on a circuit board 1100A. FIG. 11B shows an example in which three LEDs 100A, 100B, and 100C with different linear polarization are arranged in close proximity on a circuit board 1100B. FIG. 11C shows an example in which two LEDs 102A and 102B without polarization are arranged in close proximity to an LED 100 with polarization. FIG. 11D shows an example in which two LEDs 102A and 102B without polarization are arranged in close proximity to two LEDs 100A and 100B with different polarization.

Figure 12A:
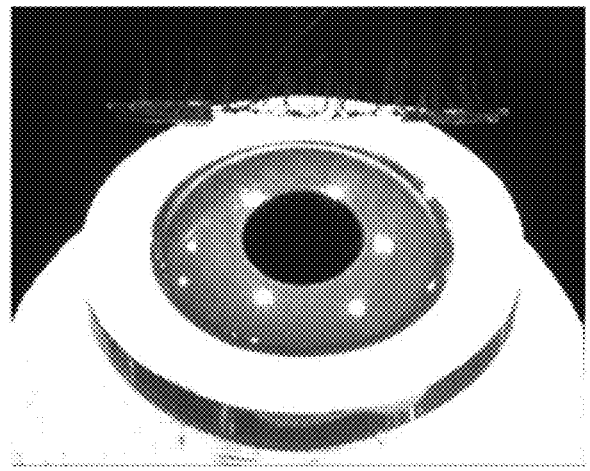
FIGS. 12A and 12B illustrate eyelash reflection reduction using polarized light, according to some embodiments.
Figure 12B:
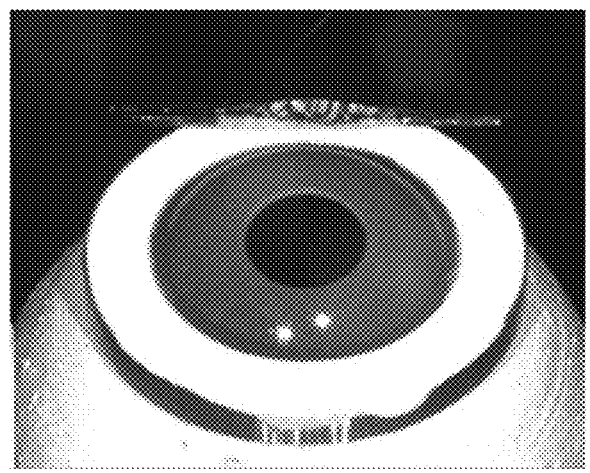

FIGS. 12A and 12B illustrate eyelash reflection reduction using polarized light, according to some embodiments. FIG. 12A shows an iris image with strong eyelash reflection captured with non-polarized light. FIG. 12C shows an iris image with reduced eyelash reflection captured with polarized light.

Figure 13A:
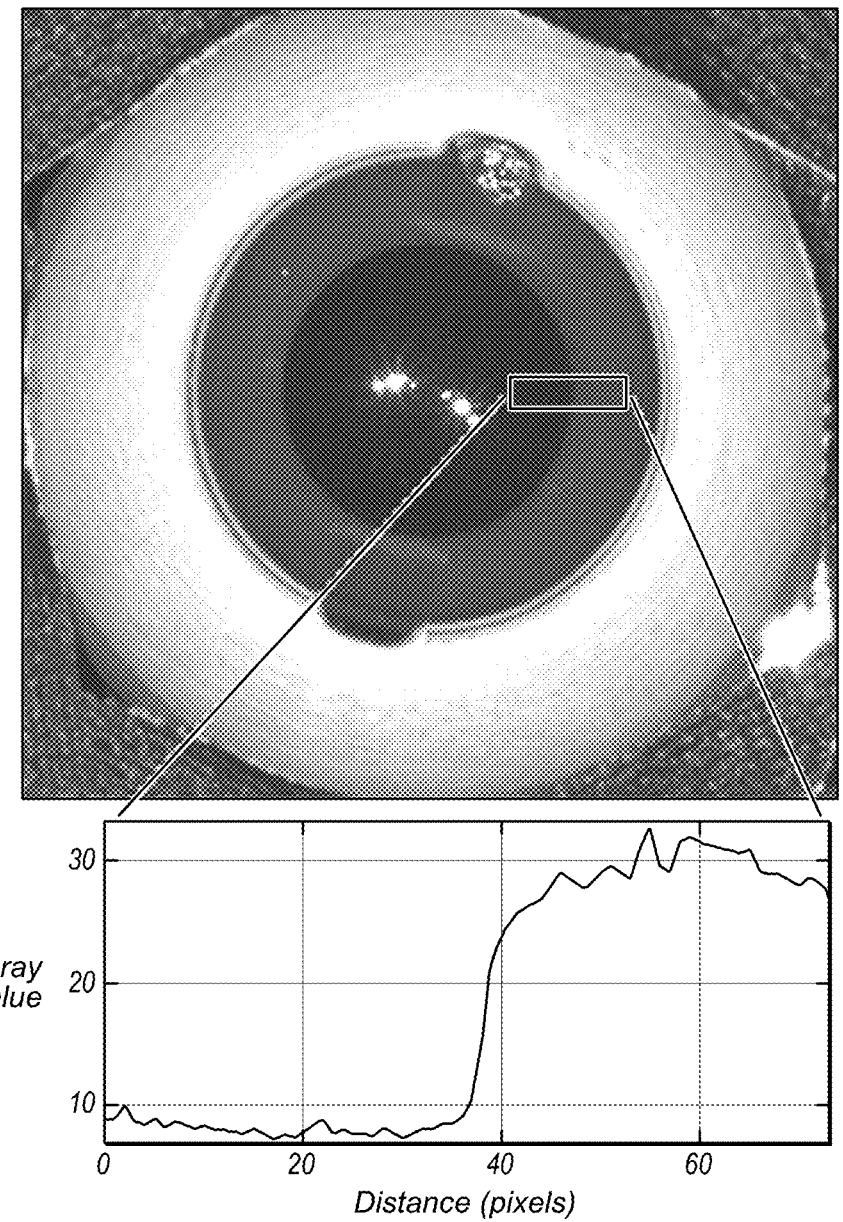
FIGS. 13A and 13B illustrate enhancement of contrast using polarized light, according to some embodiments.
Figure 13B:
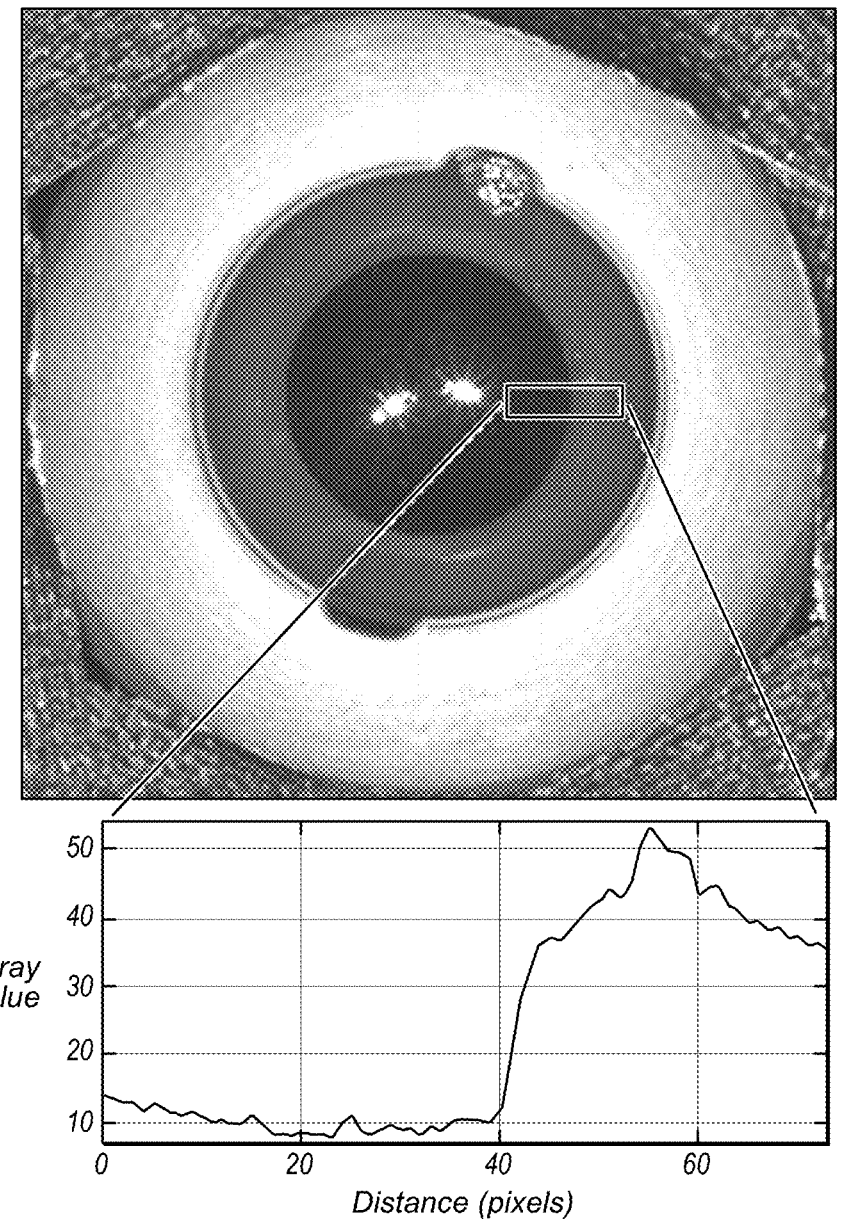

FIGS. 13A and 13B illustrate enhancement of contrast using polarized light, according to some embodiments. FIG. 13A shows an iris image with lower contrast between the iris-pupil boundary captured with non-polarized light. FIG. 13B shows an iris image with lower contrast between the iris-pupil boundary captured with polarized light.

Figure 14A:
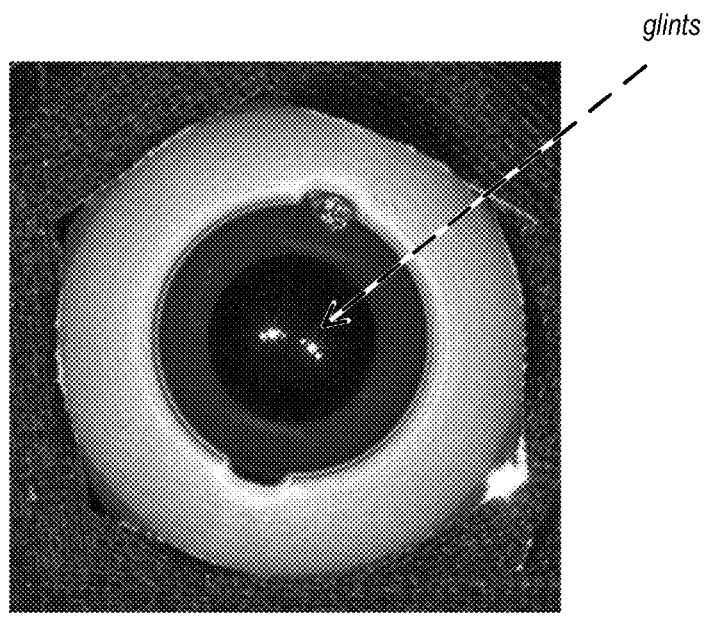
FIG. 14A illustrates unpolarized illumination of an iris, according to some embodiments.
Figure 14B:
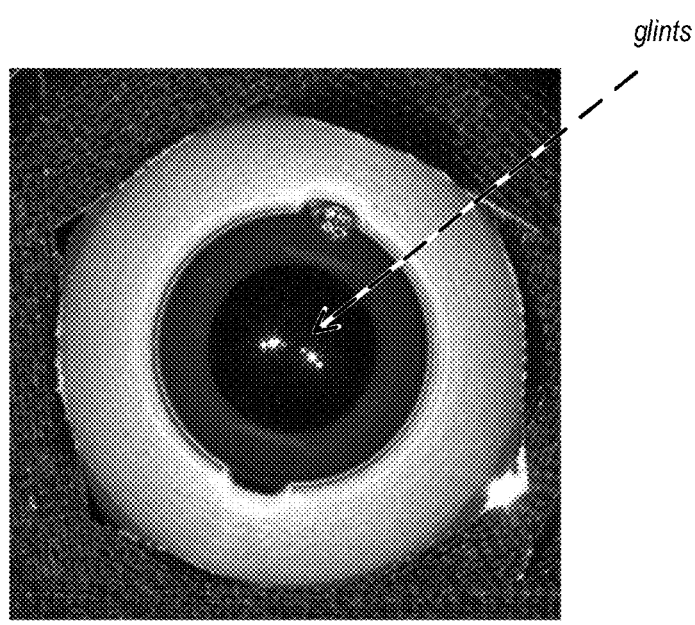
FIG. 14B illustrates unpolarized illumination of an iris with polarizers on the camera, according to some embodiments.
Figure 15A:
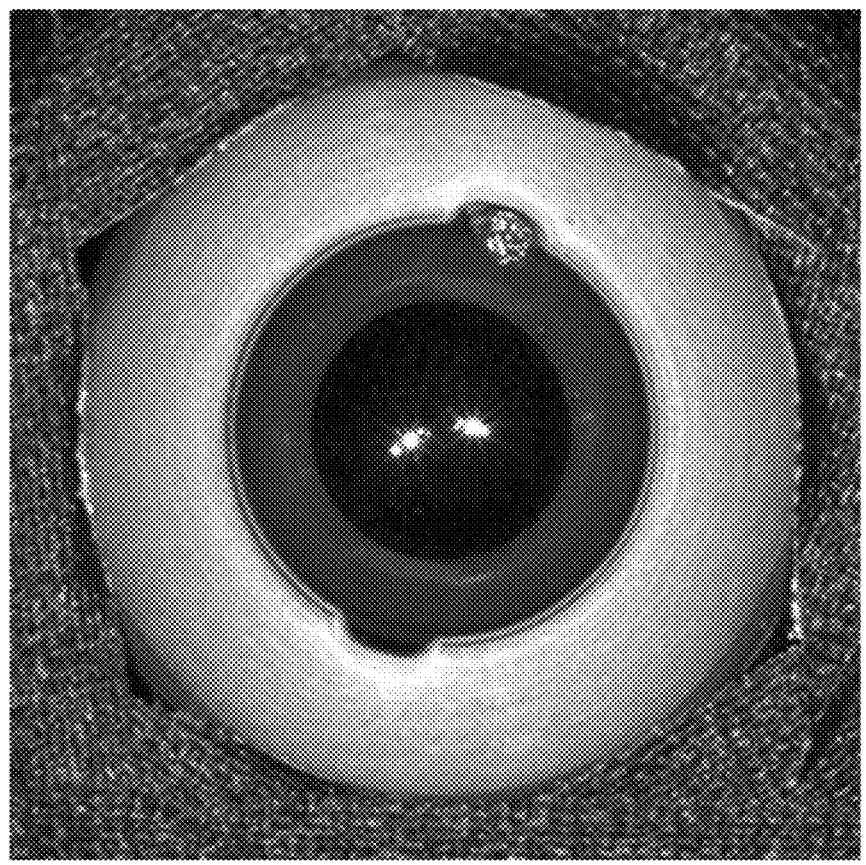
FIG. 15A illustrates polarized illumination with a parallel polarizer on the camera, according to some embodiments.
Figure 15B:
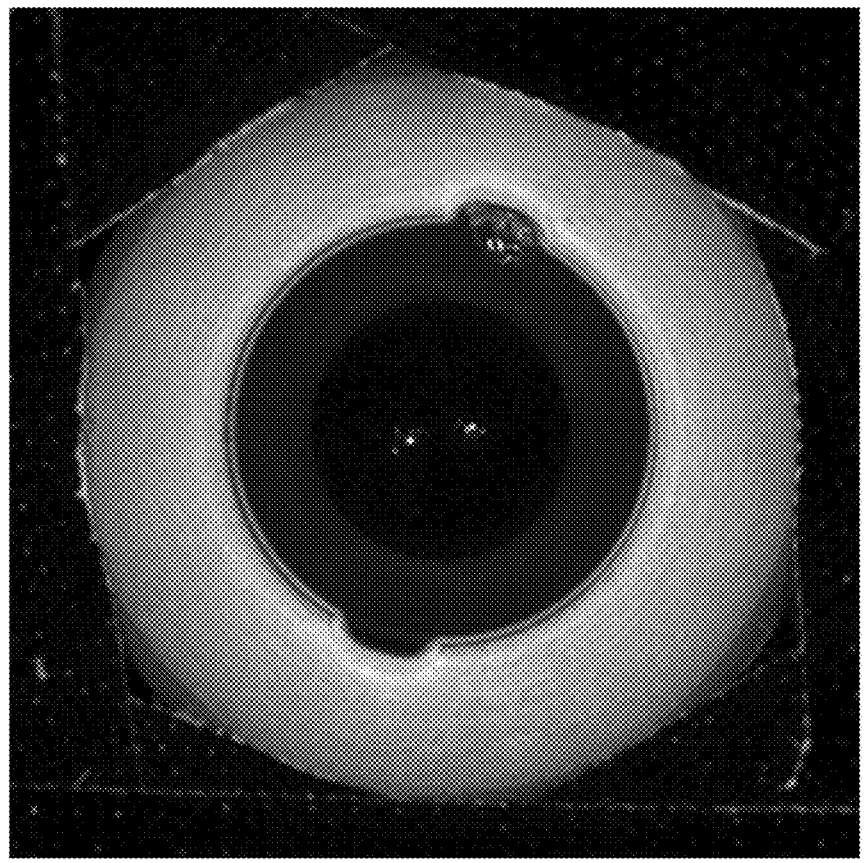
FIG. 15B illustrates polarized illumination with a crossed polarizer on the camera, according to some embodiments.
Figure 15C:
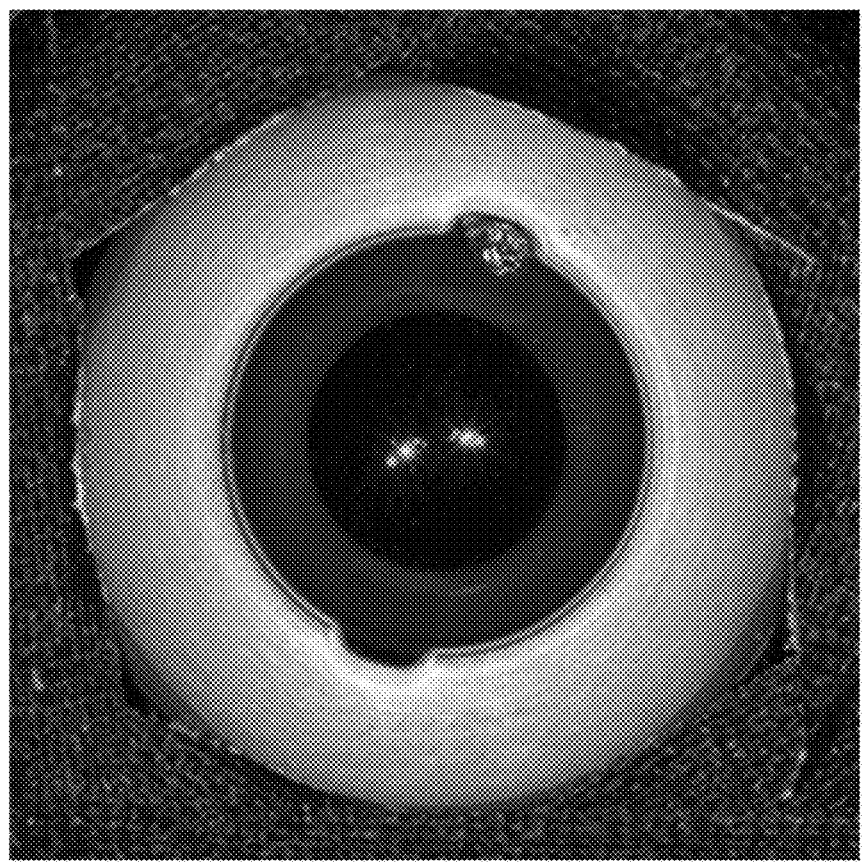
FIG. 15C illustrates polarized illumination with no polarizer on the camera, according to some embodiments.

FIG. 14A illustrates unpolarized illumination of an iris. FIG. 14B illustrates unpolarized illumination of an iris with polarizers on the camera, according to some embodiments. FIG. 15A illustrates polarized illumination with a parallel polarizer on the camera, according to some embodiments. FIG. 15B illustrates polarized illumination with a crossed polarizer on the camera, according to some embodiments. FIG. 15C illustrates polarized illumination with no polarizer on the camera, according to some embodiments.

Figure 16:
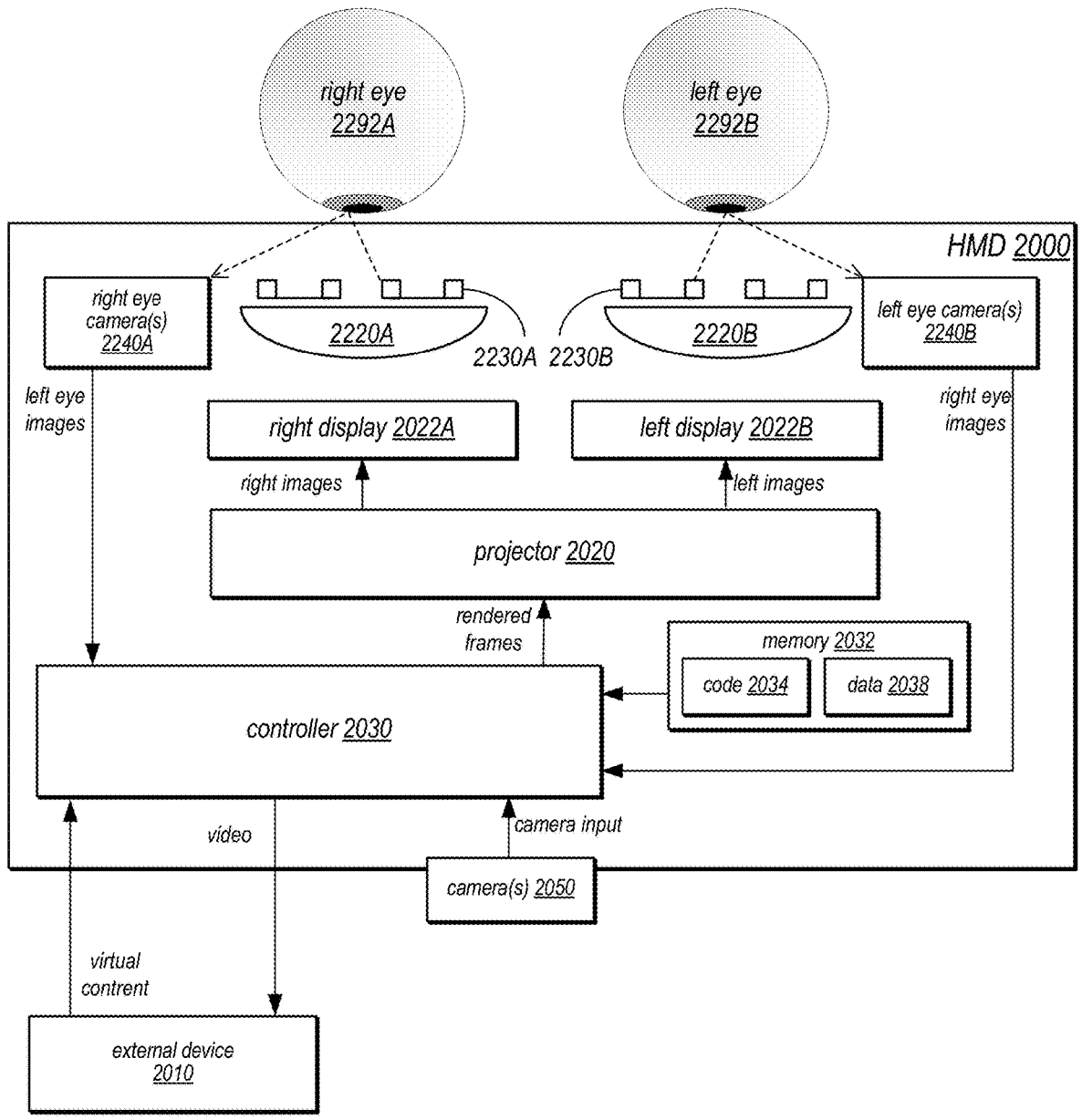
FIG. 16 is a block diagram illustrating components of an example VR/AR system that includes eye camera systems that utilize polarized light, according to some embodiments.

FIG. 16 is a block diagram illustrating components of an example VR/AR system that includes an eye camera system as described herein, according to some embodiments. In some embodiments, a VR/AR system may include an HMD 2000 such as a headset, helmet, goggles, or glasses. HMD 2000 may implement any of various types of virtual reality projector technologies. For example, the HMD 2000 may include a VR projection system that includes a projector 2020 that displays frames including left and right images on screens or displays 2022A and 2022B that are viewed by a user through eye lenses 2220A and 2220B. The VR projection system may, for example, be a DLP (digital light processing), LCD (liquid crystal display), or LCoS (liquid crystal on silicon) technology projection system. To create a three-dimensional (3D) effect in a 3D virtual view, objects at different depths or distances in the two images may be shifted left or right as a function of the triangulation of distance, with nearer objects shifted more than more distant objects. Note that other types of projection systems may be used in some embodiments.

In some embodiments, HMD 2000 may include a controller 2030 that implements functionality of the VR/AR system and that generates frames (each frame including a left and right image) that are displayed by the projector 2020. In some embodiments, HMD 2000 may also include a memory 2032 that stores software (code 2034) of the VR/AR system that is executable by the controller 2030, as well as data 2038 that may be used by the VR/AR system when executing on the controller 2030. In some embodiments, HMD 2000 may also include one or more interfaces (e.g., a Bluetooth technology interface, USB interface, etc.) that communicate with an external device 2100 via a wired or wireless connection. In some embodiments, at least a part of the functionality described for the controller 2030 may be implemented by the external device 2100. External device 2100 may be or may include any type of computing system or computing device, such as a desktop computer, notebook or laptop computer, pad or tablet device, smartphone, hand-held computing device, game controller, game system, and so on.

In various embodiments, controller 2030 may be a uniprocessor system including one processor, or a multiprocessor system including several processors (e.g., two, four, eight, or another suitable number). Controller 2030 may include central processing units (CPUs) that implement any suitable instruction set architecture, and may execute instructions defined in that instruction set architecture. For example, in various embodiments controller 2030 may include general-purpose or embedded processors implementing any of a variety of instruction set architectures (ISAs), such as the x86, PowerPC, SPARC, RISC, or MIPS ISAs, or any other suitable ISA. In multiprocessor systems, each of the processors may commonly, but not necessarily, implement the same ISA. Controller 2030 may employ any microarchitecture, including scalar, superscalar, pipelined, superpipelined, out of order, in order, speculative, non-speculative, etc., or combinations thereof. Controller 2030 may include circuitry to implement microcoding techniques. Controller 2030 may include one or more processing cores that each execute instructions. Controller 2030 may include one or more levels of caches, which may employ any size and any configuration (set associative, direct mapped, etc.). In some embodiments, controller 2030 may include at least one graphics processing unit (GPU), which may include any suitable graphics processing circuitry. Generally, a GPU may render objects to be displayed into a frame buffer (e.g., one that includes pixel data for an entire frame). A GPU may include one or more graphics processors that may execute graphics software to perform a part or all of the graphics operation, or hardware acceleration of certain graphics operations. In some embodiments, controller 2030 may include one or more other components for processing and rendering video and/or images, for example image signal processors (ISPs), coder/decoders (codecs), etc.

Memory 2032 may include any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., or low power versions of the SDRAMs such as LPDDR2, etc.), RAIVIBUS DRAM (RDRAM), static RAM (SRAM), etc. In some embodiments, one or more memory devices may be coupled onto a circuit board to form memory modules such as single inline memory modules (SIMMs), dual inline memory modules (DIMMs), etc. Alternatively, the devices may be mounted with an integrated circuit implementing system in a chip-on-chip configuration, a package-on-package configuration, or a multi-chip module configuration.

In some embodiments, the HMD 2000 may include one or more external cameras 2050 that capture video of the user's environment for AR applications. In some embodiments, the HMD 2000 may render and display frames to provide an augmented or mixed reality (AR) view for the user at least in part according to camera 2050 inputs. The AR view may include renderings of the user's environment, including renderings of real objects in the user's environment, based on video captured by one or more video cameras 2050 that capture high-quality, high-resolution video of the user's environment for display. In some embodiments, the cameras 2050 may be equipped with autofocus mechanisms. While not shown, in some embodiments, the HMD 2000 may also include one or more sensors that collect information about the user's environment and actions (depth information, lighting information, user motions and gestures, etc.). The cameras 2050 and sensors may provide the information to the controller 2030 of the VR/AR system.

As shown in FIG. 16, HMD 2000 may be positioned on the user's head such that the displays 2022A and 2022B and eye lenses 2220A and 2220B are disposed in front of the user's eyes 2292A and 2292B. IR light sources 2230A and 2230B (e.g., IR LEDs) may be positioned in the HMD 2000 (e.g., around the eye lenses 2220A and 2220B, or elsewhere in the HMD 2000) to illuminate the user's eyes 2292A and 2292B with IR light. Eye tracking cameras 2240A and 2240B (e.g., IR cameras, for example 400×400 pixel count cameras) are located at each side of the user's face. Note that the location of eye tracking cameras 2240A and 2240B is given by way of example, and is not intended to be limiting. In some embodiments, there may be a single eye tracking camera 2240 located on each side of the user's face. In some embodiments there may be two or more eye tracking cameras 2240 on each side of the user's face. For example, in some embodiments, a wide-angle camera 2240 and a narrower-angle camera 2240 may be used on each side of the user's face. A portion of IR light emitted by light sources 2230A and 2230B reflects off the user's eyes 2292A and 2292B either directly to respective eye tracking cameras 2240A and 2240B or indirectly via "hot" mirrors located between the user's eyes 2292 and the displays 2022, and is captured by the eye tracking cameras 2240A and 2240B to image the user's eyes 2292A and 2292B. Information captured by the cameras 2240A and 2240B may be provided to the controller 2030. The controller 2030 may analyze the information (e.g., images of the user's eyes 2292A and 2292B) to perform iris recognition, and/or to determine gaze direction, eye position and movement, pupil dilation, or other characteristics of the eyes 2292A and 2292B.

The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

What is claimed is:

1. An eye camera system, comprising:
   a plurality of light sources configured to emit light towards a user's eye;
   a camera configured to face toward the user's eye and oriented at an angle non-parallel to an optic axis or a visual axis of the user's eye, wherein the camera is configured to receive a portion of the light reflected off the user's eye to capture images of the user's eye; and
   at least one light polarizing element configured to be located on a light path between the light sources and the user's eye to polarize the light incident on the user's eye,
   wherein the camera is located on one side of an eyepiece, along an optical axis of the eyepiece that is configured to be positioned in front of the user's eye, the eyepiece comprises one more refractive elements that have refractive power, and the light sources are located on an opposite side of the eyepiece along the optical axis of the eyepiece.

2. The eye camera system as recited in claim 1, wherein the light sources include infrared light-emitting diode (LED) packages.

3. The eye camera system as recited in claim 2, wherein at least one of the LED packages comprises:
   a light-emitting diode (LED) attached to a substrate;
   an encapsulant covering the LED on the substrate;
   an optical filter attached to a top surface of the encapsulant; and
   a reflector substantially covering side walls of the encapsulant.

4. The eye camera system as recited in claim 3, wherein the optical filter includes the at least one light polarizing element.

5. The eye camera system as recited in claim 4, further comprising a polarizer located on the light path from the LED package to a sensor of the camera, wherein the polarizer is distinct from the at least one light polarizing element.

6. The eye camera system as recited in claim 5, wherein the polarizer is located at the sensor of the camera.

7. The eye camera system as recited in claim 5, wherein the polarizer is located in or in front of a lens system of the camera.

8. The eye camera system as recited in claim 5, wherein the polarizer is located between the camera and the user's eye.

9. The eye camera system as recited in claim 1, further comprising a polarizer located on the light path from the light sources to a sensor of the camera, wherein the polarizer is distinct from the at least one light polarizing element.

10. The eye camera system as recited in claim 9, wherein the polarizer is located at the sensor of the camera.

11. The eye camera system as recited in claim 9, wherein the polarizer is located in or in front of a lens system of the camera.

12. The eye camera system as recited in claim 9, wherein the polarizer is located between the camera and the user's eye.

13. The eye camera system as recited in claim 1, wherein the light sources include infrared light sources, and wherein the camera is an infrared camera.

14. A head-mounted display (HMD) that displays visual content for viewing by a user, wherein the HMD comprises:
a headset, a helmet, goggles, or glasses, including:
a plurality of light sources that are configured to emit light towards a user's eye;
a camera configured to face toward the user's eye and configured to capture images of the user's eye;
at least one light polarizing element located on a light path from the light sources to the camera; and
a display configured to display images;
an eyepiece having refractive power and configured to be located between the user's eye and the display,
wherein at least one of the camera or the light sources are configured to be located between the user's eye and the display; and
a controller comprising one or more processors, wherein the controller is configured to analyze polarized light images captured by the camera to perform iris recognition for the user.

15. The HMD as recited in claim 14, wherein the controller is further configured to analyze polarized light images captured by the camera to perform gaze tracking for the user.

16. The HMD as recited in claim 14,
wherein the display is configured to display images rendered by the controller; and
wherein the HMD further comprises:
an optical lens configured to be positioned between the display and the user's eye, wherein the light sources include infrared light-emitting diode (LED) packages positioned around or in front of the optical lens.

17. The HMD as recited in claim 14, wherein the light sources include infrared light-emitting diode (LED) packages.

18. The HMD as recited in claim 17, wherein at least one of the LED packages comprises:
a light-emitting diode (LED) attached to a substrate;
an encapsulant covering the LED on the substrate;
an optical filter attached to a top surface of the encapsulant; and
a reflector substantially covering side walls of the encapsulant.

19. The HMD as recited in claim 18, wherein the optical filter includes the at least one light polarizing element.

20. The HMD as recited in claim 19, further comprising a polarizer located on the light path from the LED package to a sensor of the camera, wherein the polarizer is distinct from the at least one light polarizing element.

21. The HMD as recited in claim 14, further comprising a polarizer located on the light path from the light sources to a sensor of the camera, wherein the polarizer is distinct from the at least one light polarizing element.

22. The HMD as recited in claim 14, wherein the light sources include infrared light sources, and wherein the camera is an infrared camera.

* * * * *